(12) United States Patent
Masuoka et al.

(10) Patent No.: US 8,319,288 B2
(45) Date of Patent: Nov. 27, 2012

(54) SEMICONDUCTOR DEVICE

(75) Inventors: Fujio Masuoka, Tokyo (JP); Shintaro Arai, Tokyo (JP)

(73) Assignee: Unisantis Electronics Singapore Pte Ltd., Peninsula Plaza (SG)

( * ) Notice: Subject to any disclaimer, the term of this patent is extended or adjusted under 35 U.S.C. 154(b) by 103 days.

(21) Appl. No.: 13/090,726

(22) Filed: Apr. 20, 2011

(65) Prior Publication Data

US 2011/0260259 A1 Oct. 27, 2011

Related U.S. Application Data

(60) Provisional application No. 61/326,339, filed on Apr. 21, 2010.

(30) Foreign Application Priority Data

Apr. 21, 2010 (JP) ................................. 2010-097735

(51) Int. Cl.
*H01L 27/092* (2006.01)
(52) U.S. Cl. ................................. 257/369; 257/E27.062
(58) Field of Classification Search .................. 257/369, 257/E27.062, 329, E21.643, E27.026
See application file for complete search history.

(56) References Cited

U.S. PATENT DOCUMENTS

| 7,919,990 | B2 * | 4/2011 | Masuoka et al. | 326/121 |
| 8,039,893 | B2 * | 10/2011 | Masuoka et al. | 257/329 |
| 8,212,311 | B2 * | 7/2012 | Masuoka et al. | 257/329 |
| 2004/0262681 | A1 * | 12/2004 | Masuoka et al. | 257/335 |
| 2010/0213525 | A1 * | 8/2010 | Masuoka et al. | 257/306 |

FOREIGN PATENT DOCUMENTS

| JP | 02-188966 A | 7/1990 |
| JP | 2009-038226 A | 2/2009 |

OTHER PUBLICATIONS

Watanabe, Shigeyoshi, "A Novel Circuit Technology with Surrounding Gate Transistors (SGT's) for Ultra High Density DRAM's," IEEE Journal of Solid-State Circuits, vol. 30, No. 9, Sep. 1995, pp. 960-971.

* cited by examiner

*Primary Examiner* — Colleen Matthews
(74) *Attorney, Agent, or Firm* — Brinks Hofer Gilson & Lione

(57) ABSTRACT

The CMOS inverter coupled circuit is composed of CMOS inverters using SGTs and series-connected in two or more stages. Multiple CMOS inverters share source diffusion layers on a substrate. The CMOS inverters different in the structure of a contact formed on gate wires are alternately arranged next to each other. The CMOS inverters are provided at the minimum intervals. The output terminal of a CMOS inverter is connected to the wiring layer of the next-stage CMOS inverter via the contact of the next-stage CMOS inverter.

4 Claims, 60 Drawing Sheets

SEMICONDUCTOR DEVICE

RELATED APPLICATIONS

Pursuant to 35 U.S.C. §119(e), this application claims the benefit of the filing date of Provisional U.S. patent application Ser. No. 61/326,339 filed on Apr. 21, 2010. This application also claims priority under 35 U.S.C. §119(a) to JP2010-097735 filed on Apr. 21, 2010. The entire contents of these applications are hereby incorporated by reference.

BACKGROUND OF THE INVENTION

1. Field of the Invention

The present invention relates to a semiconductor device and particularly to a two or more stage series-connected CMOS inverter among CMOS inverters using SGTs (surrounding gate transistors) that are vertical MOS transistors in which a columnar semiconductor is formed, the sidewall of the columnar semiconductor serves as a channel region, and a gate electrode formed around the channel region.

2. Description of the Related Art

In order to realize higher levels of integration and performance in semiconductor devices, SGTs (surrounding gate transistors) have been proposed that are vertical gate transistors having a columnar semiconductor layer formed on the surface of a semiconductor layer and a gate formed on the sidewall of the columnar semiconductor layer to surround it (for example, see Unexamined Japanese Patent Application KOKAI Publication No. H2-188966 and S. Watanabe et al., "A Novel Circuit Technology with Surrounding Gate Transistors (SGTs) for Ultra High Density DRAMs," IEEE JSSC, Vol. 30, No. 9, September 1995). In a SGT, the drain, gate, and source are arranged in the vertical direction. Therefore, a SGT has a significantly reduced occupying area compared with conventional planar transistors.

An example of CMOS inverters using SGTs is disclosed in the Unexamined Japanese Patent Application KOKAI Publication No. H2-188966. FIG. 37A is a plane view of the CMOS inverter disclosed in the Unexamined Japanese Patent Application KOKAI Publication No. H2-188966 and FIG. 37B is a cross-sectional view at the section line A-A' in FIG. 37A.

In FIGS. 37A and 37B, an N well 302 and a P well 303 are formed in a Si substrate 301. A columnar silicon layer 305 forming a PMOS (positive channel metal-oxide semiconductor) Qp is formed in the N well region 302 and a columnar silicon layer 306 forming an NMOS (negative channel metal-oxide semiconductor) Qn is formed in the P well region 303. A gate 308 and an element separation region 304 are each formed around the columnar silicon layer 305 and the columnar silicon layer 306. A P+ drain diffusion layer 310 formed in the lower part of the columnar silicon layer 305 forming a PMOS and an N+ drain diffusion layer 312 formed in the lower part of the columnar silicon layer 306 forming an NMOS are connected to an output terminal Vout. A P+ source diffusion layer 309 formed in the upper part of the columnar silicon layer 305 forming a PMOS is connected to a power supply potential Vcc via a Vcc wiring layer 314. An N+ source diffusion layer 311 formed in the upper part of the columnar silicon layer 306 forming an NMOS is connected to a ground potential Vss via a Vss wiring layer 315. The gate 308 shared by the PMOS and NMOS is connected to an input terminal (Vin) 316. With the above structure, a CMOS inverter is formed.

As an example of two or more stage series-connected CMOS inverters, FIG. 38A is a plane view of a two-stage CMOS inverter and FIG. 38B is a cross-sectional view at the section line A-A' in FIG. 38A (see S. Watanabe et al., "A Novel Circuit Technology with Surrounding Gate Transistors (SGTs) for Ultra High Density DRAMs," IEEE JSSC, Vol. 30, No. 9, September 1995).

In FIGS. 38A and 38B, a P+ diffusion layer 418 and an N+ diffusion layer 419 are formed in a silicon substrate. A power supply potential Vcc is given to the P+ diffusion layer 418 via a wiring layer 436 and a ground potential Vss is given to the N+ diffusion layer 419 via a wiring layer 435. Columnar silicon layers 411 to 414 composing PMOSs are formed on the P+ diffusion layer 418. Columnar silicon layers 415 to 417 composing NMOSs are formed on the N+ diffusion layer 419. The first-stage inverter is formed by PMOSs composed of the columnar silicon layers 413 and 414 and an NMOS composed of the columnar silicon layer 415. A common gate 422 is formed around the columnar silicon layers 413, 414, and 415. An input voltage to the first-stage inverter is given to the gate 422 via a wiring layer 433 and a contact 426 formed on the gate 422. The output voltage of the first-stage inverter is given to a wiring layer 437 via contacts 429 and 430 formed on the columnar silicon layers 413, 414, and 415.

The second-stage inverter is formed by PMOSs composed of the columnar silicon layers 411 and 412 and NMOSs composed of the columnar silicon layers 416 and 417. A gate 421 is formed around the columnar silicon layers 411 and 412. A gate 423 is formed around the columnar silicon layers 416 and 417. An input voltage to the second-stage inverter is given to the gate 421 via a wiring layer 437 and a contact 427 formed on the gate. An input voltage to the second-stage inverter is given to the gate 423 via a wiring layer 437 and a contact 428 formed on the gate. The output voltage of the second-stage inverter is given to a wiring layer 434 via contacts 431 and 432 formed on the columnar silicon layers 411, 412, 416, and 417.

In this two-stage inverter, a contact 424 connecting the wiring layer 436 to which a power supply potential Vcc is given and the P+ diffusion layer 418 and a contact 425 connecting the wiring layer 435 to which a ground potential Vss is given and the N+ diffusion layer 419 have large occupying areas. For this reason, the two-stage inverter has a large occupying area.

As another example of two or more stage series-connected CMOS inverters, FIG. 39A is a plane view of a CMOS inverter chain disclosed in the Unexamined Japanese Patent Application KOKAI Publication No. 2009-38226 and FIG. 39B is a cross-sectional view at the section line A-A' in FIG. 39A.

In FIGS. 39A and 39B, columnar semiconductor layers 511, 512, 515, 516, 517, 518, 521, and 522 composing PMOSs and columnar semiconductor layers 513, 514, 519, and 520 composing NMOSs are formed on a silicon oxide film (SiO2 film). The first-stage inverter is formed by PMOSs composed of the columnar semiconductor layers 521 and 522 and an NMOS composed of the columnar semiconductor layer 520. A common gate 530 is formed around the columnar semiconductor layers 520, 521, and 522. A power supply potential is given to a diffusion layer formed in the upper parts of the columnar semiconductor layers 521 and 522 composing PMOSs via a wiring layer 535. A ground potential is given to a diffusion layer formed in the upper part of the columnar semiconductor layer 520 composing an NMOS via a wiring layer 534. The second-stage inverter is formed by PMOSs composed of the columnar semiconductor layers 517 and 518 and an NMOS composed of the columnar semiconductor layer 519. A common gate 529 is formed around the columnar semiconductor layers 517, 518, and 519. An input potential is given to the gate 529 via a lower wiring layer 525. A power supply potential is given to a diffusion layer formed in the upper parts of the columnar semiconductor layers 517 and 518 composing PMOSs via a wiring layer 533. A ground potential is given to a diffusion layer formed in the upper part of the columnar semiconductor layer 519 composing an NMOS via a wiring layer 534.

The above unit structure is repeated to form an inverter chain composed of the columnar semiconductor layers 511 to 522, lower wiring layers 523 to 526, gates 527 to 530, and wiring layers 531 to 535.

In the above prior art embodiment, the layout of diffusion layers and gate wiring composing a circuit is complex. NMOSs and PMOSs are alternately provided in a small area. Therefore, it is difficult to form a highly integrated inverter for use in a device as small as several tens nm. The Unexamined Japanese Patent Application KOKAI Publication No. 2009-38226 proposes parallel connection of the entire inverter circuit shown in FIG. 39 in order to increase the number of pillars formed in parallel. However, in such a case, even the portions making no direct contribution to the capability of the device such as element separation regions are repeatedly provided. This is not an efficient way of increasing the number of pillars formed in parallel.

As described above, the prior art structure of two or more stage series-connected CMOS inverters must be improved in terms of reduction in the occupying area.

SUMMARY OF THE INVENTION

The present invention is made in view of the above circumstances and the purpose of the present invention is to realize a two or more stage series-connected CMOS inverter with a small occupying area.

In order to achieve the above purpose, the semiconductor device according to the first aspect of the present invention is a semiconductor device comprising a CMOS inverter coupled circuit in which CMOS inverters are connected in at least two or more stages, wherein the CMOS inverters are composed of vertical MOS transistors in which a source diffusion layer, a drain diffusion layer, and a columnar semiconductor layer are provided in a vertical hierarchical structure, the columnar semiconductor layer is provided between the source diffusion layer and drain diffusion layer, and a gate electrode is formed on the sidewall of the columnar semiconductor layer; the CMOS inverter coupled circuit includes a first CMOS inverter in the first stage that is composed of multiple vertical MOS transistors aligned in the first column on a substrate and a second CMOS inverter in the second stage that is composed of multiple vertical MOS transistors aligned in the second column on the substrate; the multiple vertical MOS transistors aligned in the first column are composed of one or multiple first NMOS vertical transistors formed on a first N+ source diffusion layer and one or multiple first PMOS vertical transistors formed on a first P+ source diffusion layer; the first N+ source diffusion layer and first P+ source diffusion layer are formed next to each other; a first potential is supplied to the first N+ source diffusion layer and a second potential is supplied to the first P+ source diffusion layer; the gate electrode of the one or multiple first NMOS vertical transistors and the gate electrode of the one or multiple first PMOS vertical transistors are connected and form a first gate wire; a first contact for supplying an input voltage to the first CMOS inverter is formed at an end of the first gate wire; a first N+ drain diffusion layer is formed in the upper part of columnar semiconductor layers composing the one or multiple first NMOS vertical transistors, and a second contact connecting the first N+ drain diffusion layer and a first wiring layer to which the output voltage of the first inverter is output is formed on the first N+ drain diffusion layer; a first P+ drain diffusion layer is formed in the upper part of columnar semiconductor layers composing the one or multiple first PMOS vertical transistors, and a third contact connecting the first P+ drain diffusion layer and the first wiring layer to which the output voltage of the first inverter is output is formed on the first P+ drain diffusion layer; the multiple vertical MOS transistors aligned in the second column are formed by one or multiple second NMOS vertical transistors formed on the first N+ source diffusion layer and one or multiple second PMOS vertical transistors formed on the first P+ source diffusion layer; the gate electrode of the one or multiple second NMOS vertical transistors and the gate electrode of the one or multiple second PMOS vertical transistors are connected and form a second gate wire; a fourth contact for supplying an input voltage to the second CMOS inverter is formed at the other end of the second gate wire; the fourth contact is connected to the first wiring layer; a second N+ drain diffusion layer is formed in the upper part of columnar semiconductor layers composing the one or multiple second NMOS vertical transistors, and a fifth contact connecting the second n+ drain diffusion layer and a second wiring layer to which the output voltage of the second CMOS inverter is output is formed on the second N+ drain diffusion layer; a second P+ drain diffusion layer is formed in the upper part of columnar semiconductor layers composing the one or multiple second PMOS vertical transistors, and a sixth contact connecting the second P+ drain diffusion layer and the second wiring layer to which the output voltage of the second CMOS inverter is output is formed on the second P+ drain diffusion layer; and the first CMOS inverter and second CMOS inverter are alternately connected.

In order to achieve the above purpose, the semiconductor device according to the second aspect of the present invention is a semiconductor device comprising a CMOS inverter coupled circuit in which CMOS inverters are connected in at least two or more stages, wherein the CMOS inverters are composed of vertical MOS transistors in which a source diffusion layer, a drain diffusion layer, and a columnar semiconductor layer are provided in a vertical hierarchical structure, the columnar semiconductor layer is provided between the source diffusion layer and drain diffusion layer, and a gate electrode is formed on the sidewall of the columnar semiconductor layer; the CMOS inverter coupled circuit includes a first CMOS inverter in the first stage that is composed of multiple vertical MOS transistors aligned in the first column on a substrate and a second CMOS inverter in the second stage that is composed of multiple vertical MOS transistors aligned in the second column on the substrate; the multiple vertical MOS transistors aligned in the first column are composed of one or multiple first NMOS vertical transistors formed on a first N+ source diffusion layer and one or multiple first PMOS vertical transistors formed on a first P+ source diffusion layer; the first N+ source diffusion layer and first P+ source diffusion layer are formed next to each other; a first potential is supplied to the first N+ source diffusion layer and a second potential is supplied to the first P+ source diffusion layer; the gate electrode of the one or multiple first NMOS vertical transistors and the gate electrode of the one or multiple first PMOS vertical transistors are connected and form a first gate wire; a first contact for supplying an input voltage to the first CMOS inverter is formed on the first gate wire in the region above an element separation formed between the first N+ source diffusion layer and first P+ source diffusion layer; a first N+ drain diffusion layer is formed in the upper part of columnar semiconductor layers forming the one or multiple first NMOS vertical transistors, and a second contact connecting the first N+ drain diffusion layer and a first wiring layer to which the output voltage of the first inverter is output is formed on the first N+ drain diffusion layer; a first P+ drain diffusion layer formed is in the upper part of columnar semiconductor layers composing the one or multiple first PMOS vertical transistors, and a third contact connecting the first P+ drain diffusion layer and a second wiring layer to which the output voltage of the first inverter is output is formed on the first P+ drain diffusion layer; the multiple vertical MOS transistors aligned in the second column are formed by one or multiple second NMOS vertical transistors formed on the first N+ source diffusion layer and one or multiple second PMOS vertical transistors formed on the first P+ source diffusion layer; the gate electrode of the one or multiple second NMOS vertical transistors and the gate electrode of the one or multiple second PMOS vertical transistors are connected and form a second gate wire; a fourth contact for supplying an input voltage to the second CMOS inverter is formed at one end of the second gate wire; the fourth contact is connected to the first wiring layer; a fifth contact for supplying an input voltage to the second CMOS inverter is formed at the other end of the second gate wire; the fifth contact is connected to the second wiring layer; a second N+ drain diffusion layer is formed in the upper part of columnar semiconductor layers forming the one or multiple second PMOS vertical transistors, and a sixth contact connecting the second N+ drain diffusion layer and a third wiring layer to which the output voltage of the second CMOS inverter is output is formed on the second N+ drain diffusion layer; a second P+ drain diffusion layer is formed in the upper part of columnar semiconductor layers composing the one or multiple second PMOS vertical transistors, and a seventh contact connecting the second P+ drain diffusion layer and the third wiring layer to which the output voltage of the second CMOS inverter is output is formed on the second P+ drain diffusion layer; and the first CMOS inverter and second CMOS inverter are alternately connected.

In order to achieve the above purpose, the semiconductor device according to the third aspect of the present invention is a semiconductor device comprising a CMOS inverter coupled circuit in which CMOS inverters are connected in at least two or more stages, wherein the CMOS inverters are composed of vertical MOS transistors in which a source diffusion layer, a drain diffusion layer, and a columnar semiconductor layer are provided in a vertical hierarchical structure, the columnar semiconductor layer is provided between the source diffusion layer and drain diffusion layer, and a gate electrode is formed on the sidewall of the columnar semiconductor layer; the CMOS inverter coupled circuit includes a first CMOS inverter in the first stage that is composed of multiple vertical MOS transistors aligned in the first column on a substrate and a second CMOS inverter in the second stage that is composed of multiple vertical MOS transistors aligned in the second column on the substrate; the multiple vertical MOS transistors aligned in the first column are composed of one or multiple first NMOS vertical transistors formed on a first N+ source diffusion layer and one or multiple first PMOS vertical transistors formed on a first P+ source diffusion layer; the first N+ source diffusion layer and first P+ source diffusion layer are formed next to each other; a first potential is supplied to the first N+ source diffusion layer and a second potential is supplied to the first P+ source diffusion layer; the gate electrode of the one or multiple first NMOS vertical transistors and the gate electrode of the one or multiple first PMOS vertical transistors are connected and form a first gate wire; a first contact for supplying an input voltage to the first CMOS inverter is formed on the first gate wire in the region above an element separation formed between the first N+ source diffusion layer and first P+ source diffusion layer; a first N+ drain diffusion layer is formed in the upper part of columnar semiconductor layers forming the one or multiple first NMOS vertical transistors, and a second contact connecting the first N+ drain diffusion layer and a first wiring layer to which the output voltage of the first inverter is output is formed on the first N+ drain diffusion layer; a first P+ drain diffusion layer is formed in the upper part of columnar semiconductor layers composing the one or multiple first PMOS vertical transistors, and a third contact connecting the first P+ drain diffusion layer and a second wiring layer to which the output voltage of the first inverter is output is formed on the first P+ drain diffusion layer; the first wiring layer and second wiring layer are connected by a third wiring layer formed on a layer above the first wiring layer and the second wiring layer; the multiple vertical MOS transistors aligned in the second column are formed by one or multiple second NMOS vertical transistors formed on the first N+ source diffusion layer and one or multiple second PMOS vertical transistors formed on the first P+ source diffusion layer; the gate electrode of the one or multiple second NMOS vertical transistors and the gate electrode of the one or multiple second PMOS vertical transistors are connected and form a second gate wire; a fourth contact for supplying an input voltage to the second CMOS inverter is formed at one end of the second gate wire; the fourth contact is connected to the first wiring layer or the second wiring layer; a fifth contact connecting a second N+ drain diffusion layer formed in the upper part of columnar semiconductor layers forming the one or multiple second NMOS vertical transistors and a fourth wiring layer to which the output voltage of the second CMOS inverter is output is formed on the second N+ drain diffusion layer; a second P+ drain diffusion layer is formed in the upper part of columnar semiconductor layers composing the one or multiple second PMOS vertical transistors, and a sixth contact connecting the second P+ drain diffusion layer and the fourth wiring layer to which the output voltage of the second CMOS inverter is output is formed on the second P+ drain diffusion layer; and the first CMOS inverter and second CMOS inverter are alternately connected.

BRIEF DESCRIPTION OF THE DRAWINGS

A more complete understanding of this application can be obtained when the following detailed description is considered in conjunction with the following drawings, in which.

DETAILED DESCRIPTION OF THE PREFERRED EMBODIMENTS

The semiconductor device according to an embodiment of the present invention will be described hereafter with reference to FIGS. 1 to 36B. FIGS. 2A, 2B, 4A, 4B, 6A, 6B, 8A, 8B, 10A, 10B, 12A, 12B, 14A, 14B, 16A, 16B, 18A, 18B, 20A, 20B, 22A, 22B, 24A, 24B, 26A, 26B, 28A, 28B, 30A, 30B, 32A, 32B, 34A, 34B, 36A, and 36B are plane views and include hatched areas in part for distinction of regions.

Embodiment 1

Figure 1:
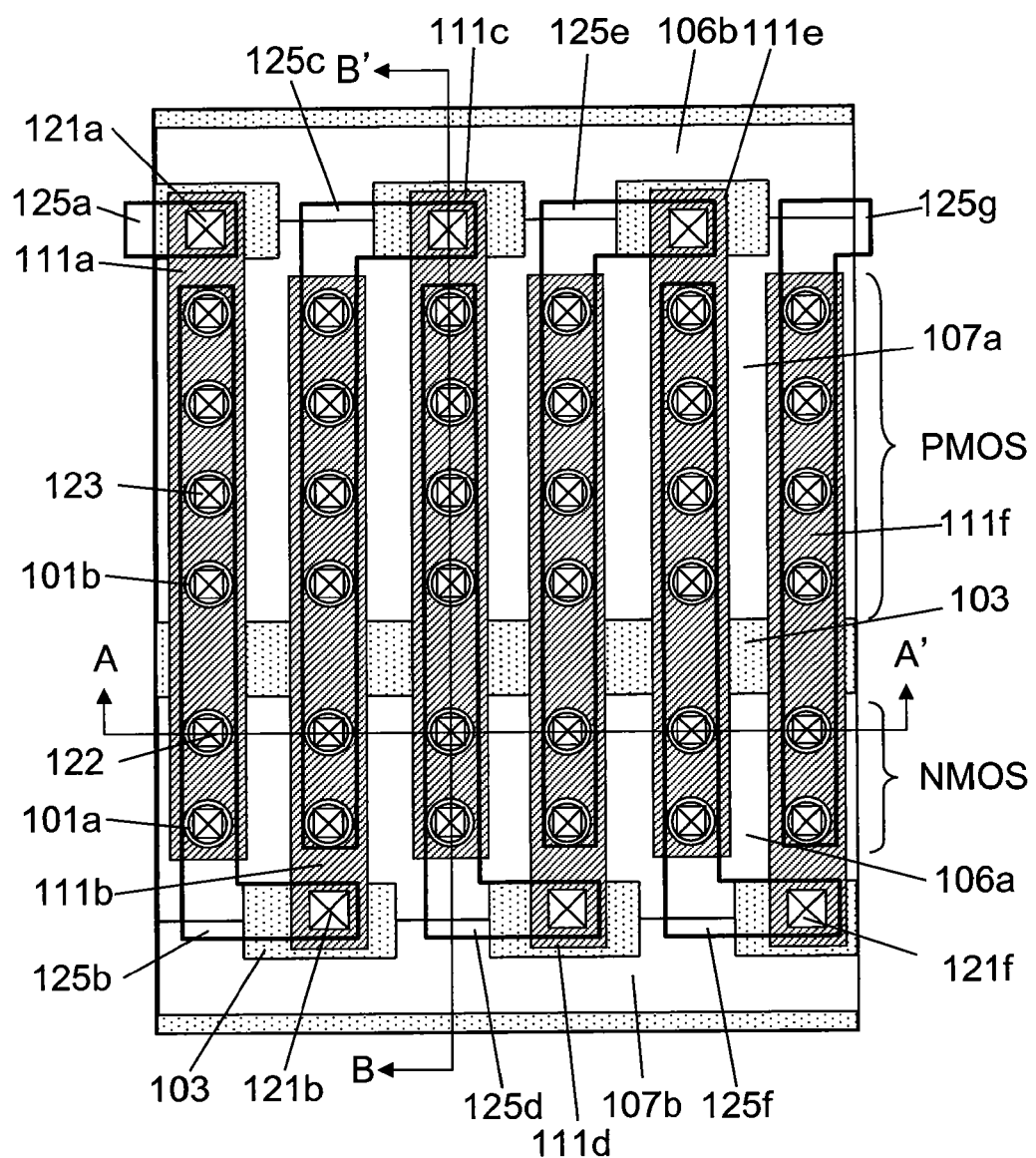
FIG. 1 is a plane view of the semiconductor device according to Embodiment 1 of the present invention.
Figure 2A:
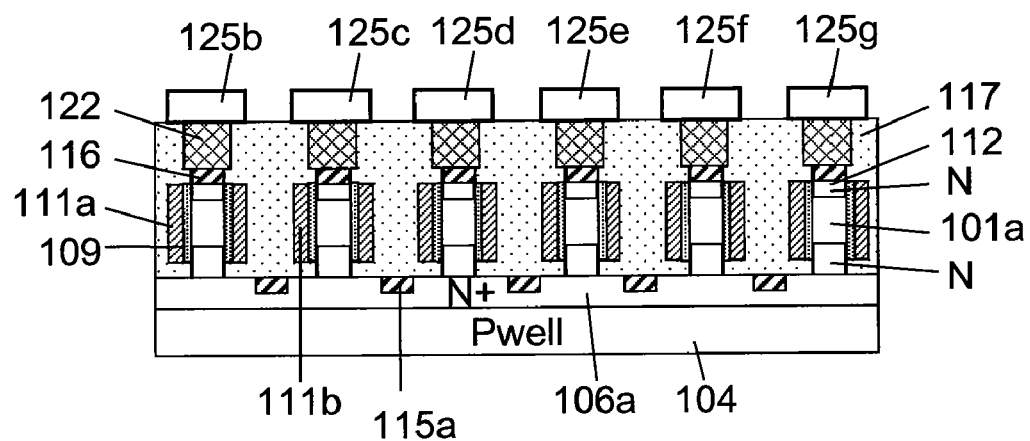
FIG. 2A is a cross-sectional view of the semiconductor device according to Embodiment 1 at the line A-A' in FIG. 1.
Figure 2B:
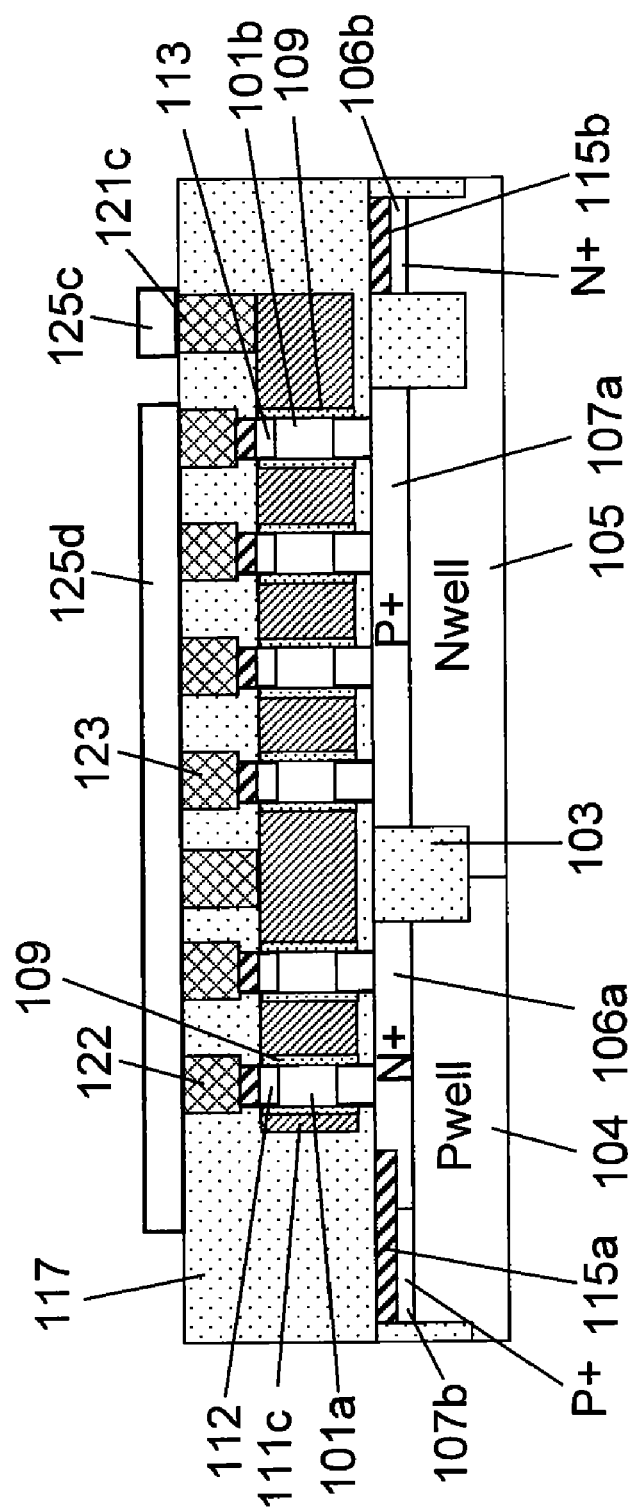
FIG. 2B is a cross-sectional view of the semiconductor device according to Embodiment 1 at the line B-B' in FIG. 1.

FIGS. 1, 2A and 2B show a semiconductor device comprising a two or more stage series-connected CMOS inverter coupled circuit according to Embodiment 1 of the present invention. FIG. 1 is a plane view, FIG. 2A is a cross-sectional view at the section line A-A' in FIG. 1, and FIG. 2B is a cross-sectional view at the section line B-B' in FIG. 1.

The semiconductor device comprising a CMOS inverter coupled circuit will be described hereafter with reference to FIGS. 1, 2A, and 2B.

An N+ diffusion layer 106a is formed in an NMOS region on a substrate and a P+ diffusion layer 107a is formed in a PMOS region on the substrate. The N+ diffusion layer 106a and P+ diffusion layer 107a are separated by an element separation region 103. The N+ diffusion region 106a functions as a source diffusion region shared by the vertical NMOS transistors of all inverters composing a CMOS inverter chain. The P+ diffusion region 107a functions as a source diffusion region shared by the vertical PMOS transistors of all inverters composing the CMOS inverter chain.

The N+ diffusion layer 106*a* is surrounded by a P well 104 and connected to a P+ diffusion layer 107*b* formed next to the N+ diffusion layer 106*a* via a silicide layer 115*a* formed on the surface of the P+ diffusion layer 106*a*. In operation, a potential Vss (generally, a ground potential) is given to the P+ diffusion layer 107*b* via a wiring layer. Therefore, the potential Vss is given to the P well 104 and N+ diffusion layer 106*a*.

Similarly, the P+ diffusion layer 107*a* is surrounded by an N well 105 and connected to an N+ diffusion layer 106*b* formed next to the P+ diffusion layer 107*a* via a silicide layer 115*b*. In operation, a potential Vcc (generally, a power supply potential) is given to the N+ diffusion layer 106*b* via a wiring layer. Therefore, the potential Vcc is given to the N well 105 and P+ diffusion layer 107*a*.

Columnar silicon layers 101*a* composing NMOSs are formed on the N+ diffusion layer 106*a* and multiple columnar silicon layers 101*b* composing PMOSs are formed on the P+ diffusion layer 107*a*. The columnar silicon layer 101*a* and the columnar silicon layer 101*b* are arranged in a matrix. The columnar silicon layer 101*a* and the columnar silicon layer 101*b* in the same column of the matrix are aligned nearly on a line. The columnar silicon layer 101*a* and the columnar silicon layer 101*b* in the same column compose a stage of inverter. The columnar silicon layer 101*a* and the columnar silicon layer 101*b* in the same row of the matrix are aligned nearly on a line.

A gate insulating film 109 is formed around each of the columnar silicon layers 101*a* and 101*b*. Gate wires 111*a* to 111*f* are formed around the columnar silicon layers 101*a* and 101*b* in each column (forming a stage of inverter).

The columnar silicon layer 101*a* is connected to the N+ diffusion layer 106*a* at the lower end, where an N+ diffusion layer is formed. An N+ upper diffusion layer 112 is formed in the upper end part of the columnar silicon layer 101*a*. The N+ diffusion layer in the lower end part of the columnar silicon layer 101*a* serves as a source region. The N+ upper diffusion layer 112 in the upper end part of the columnar silicon layer 101*a* serves as a drain. The part between the source and drain regions serves as a channel region.

The columnar silicon layer 101*b* is connected to the P+ diffusion layer 107*a* at the lower end, where a P+ diffusion layer is formed. A P+ upper diffusion layer 113 is formed in the upper end part of the columnar silicon layer 101*b*. The P+ diffusion layer in the lower end part of the columnar silicon layer 101*b* serves as a source region. The P+ upper diffusion layer 113 in the upper end part of the columnar silicon layer 101*b* serves as a drain. The part between the source and drain regions serves as a channel region. The gate wires (gate electrode layers) 111*a* to 111*f* surround the channel region. In this way, a SGT (surrounding gate transistor) is formed.

The columnar silicon layers 101*a* and 101*b*, gate wires 111*a* to 111*f*, and silicide layers 115*a* and 115*b* are covered with an insulating film 117.

Gate wire contacts 121*a* to 121*f* that serve as input contacts of each inverter and columnar silicon layer contacts 122 and 123 that serve as output contacts are formed in the insulating film 117.

The gate wire contacts 121*a* to 121*f* are provided at one end of each column of the columnar silicon layers 101*a* and 101*b* and connected to the gate wires 111*a* to 111*f*, respectively. The input contacts 121 are positioned alternately by column. The columnar silicon layer contact 122 is connected to the N+ upper diffusion layer 112 formed in the upper end part of the columnar silicon layer 101*a* via the silicide layer 115*a* of the NMOS. The columnar silicon layer contact 123 is electrically connected to the P+ upper diffusion layer 113 formed in the upper end part of the columnar silicon layer 101*b* via the silicide layer 115*b* of the PMOS.

A wiring layer 125 (125*a* to 125*g*) is formed on the insulating film 117. The wiring layers 125*a* to 125*g* include a wiring layer 125*a* connected to the gate wire contact 121*a* of the first-stage inverter, wiring layers 125*b* to 125*f* connecting the columnar silicon layer contact 122 that serves as the NMOS output contact and the columnar silicon layer contact 123 that serves as the PMOS output contact of the inverter in each stage to each other and connected to the gate wire contacts 121*b* to 121*f* of the inverter in the next stage, and a wiring layer 125*g* connecting the output contacts 122 and 123 of the last-stage inverter to each other and connected to an external circuit.

With the above structure, an input voltage to the inverter chain is transferred to the gate wire 111*a* of the first-stage inverter via the wiring layer 125*a* and the gate wire contact 121*a* of the first-stage inverter.

The output voltage of the first-stage inverter is output to the wiring layer 125*b* connected to the columnar silicon layer contacts 122 and 123 formed on the N+ and P+ upper diffusion layers 112 and 113 of the columnar silicon layers 101*a* and 101*b*. The output voltage is supplied as the input voltage to the gate wire contact 121*b* formed at an end of the gate wire 111*b* of the inverter in the next stage.

With the above basic structure being repeated, the inverters are series-connected to each other.

The CMOS inverter of this embodiment is characterized in that all inverters share the N+ diffusion layer 106*a* and P+ diffusion layer 107*a* and no element separation region is provided between inverters. Therefore, the columnar silicon layers composing adjacent inverters can be provided nearly at the minimum intervals. When the columnar silicon layers composing adjacent inverters are provided nearly at the minimum intervals, difficulty in connection between the input terminal and output terminal is generally a problem. In this embodiment, in this regard, the inverters having a contact for the gate wire to which an input voltage is given at the different ends of the gate wire are alternately provided next to each other. Then, the input terminal of the n+1-st stage inverter and the output terminal of the n-th stage inverter can be connected via a wiring layer. Therefore, a two or more stage series-connected CMOS inverter can be highly integrated.

An exemplary production method of the semiconductor device shown in FIGS. 1, 2A, and 2B will be described hereafter with reference to FIGS. 3 to 32B. A plane view and cross-sectional views at the section line A-A' and section line B-B' in the plane view are given for each production step.

Figure 3:
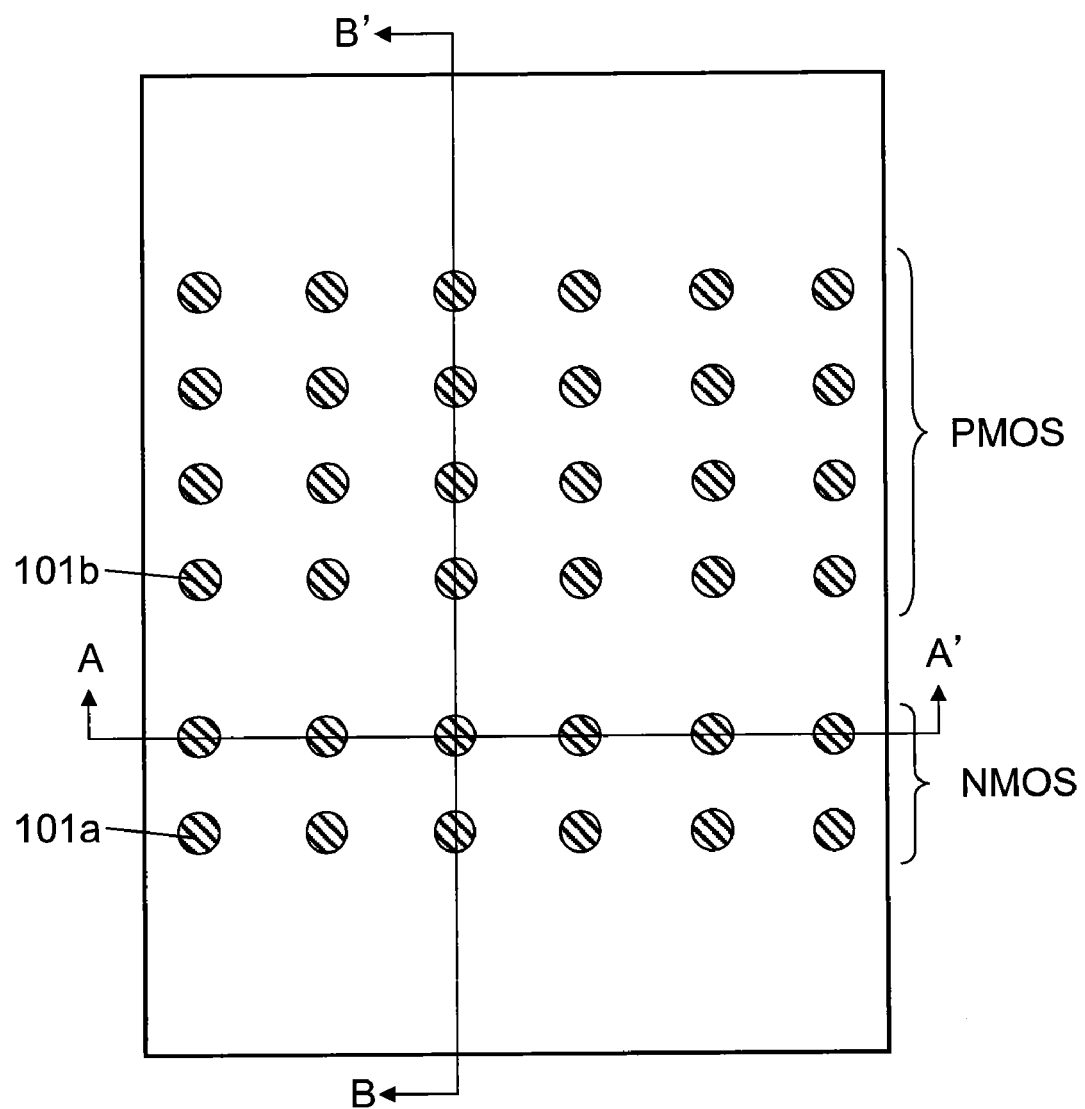
FIG. 3 is a plane view for explaining a production method of the semiconductor device according to Embodiment 1.
Figure 4A:
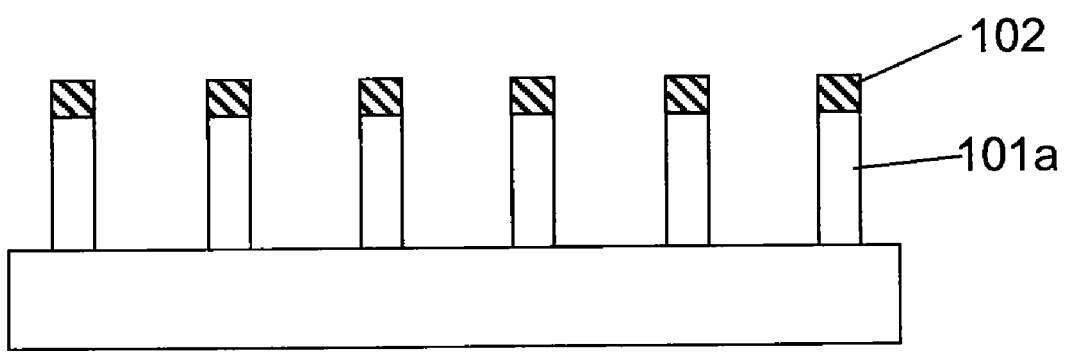
FIG. 4A is a cross-sectional view at the line A-A' in FIG. 3 for explaining a production method of Embodiment 1.
Figure 4B:
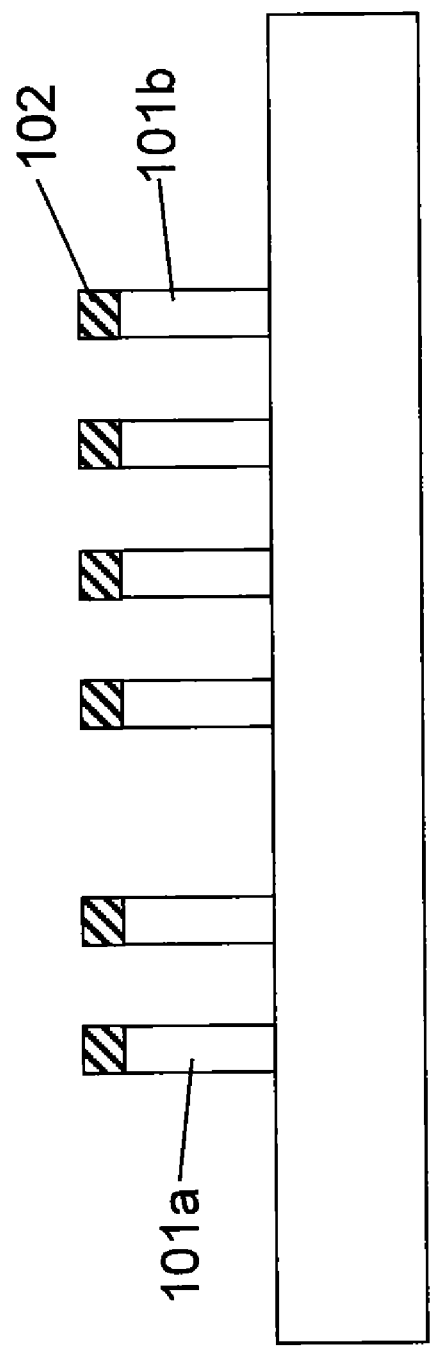
FIG. 4B is a cross-sectional view at the line B-B' in FIG. 3 for explaining a production method of Embodiment 1.

First, a hard mask layer such as a silicon nitride film is formed on a silicon substrate. Then, the hard mask layer is patterned to leave a hard mask layer 102 in regions where columnar silicon layers are to be formed. Then, the surface of the substrate is etched by a predetermined thickness using the hard mask layer 102 as a mask to form the hard mask layer 102 and columnar silicon layers 101*a* and 101*b* on the substrate as shown in FIGS. 3, 4A, and 4B. As described above, the columnar silicon layers 101*a* compose NMOSs and the columnar silicon layers 101*b* compose PMOSs.

Figure 5:
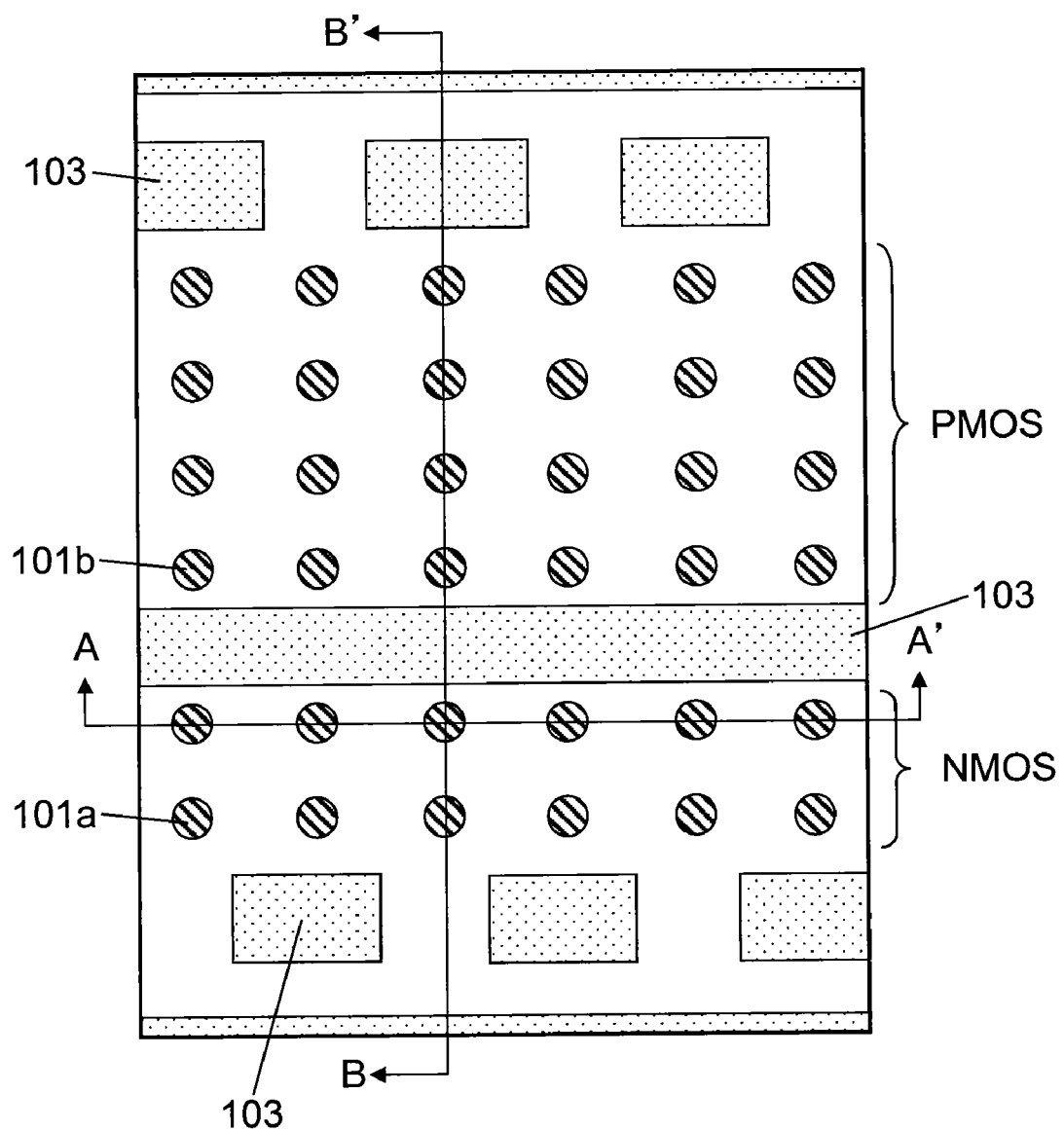
FIG. 5 is a plane view showing a production method of the semiconductor device according to Embodiment 1.
Figure 6A:
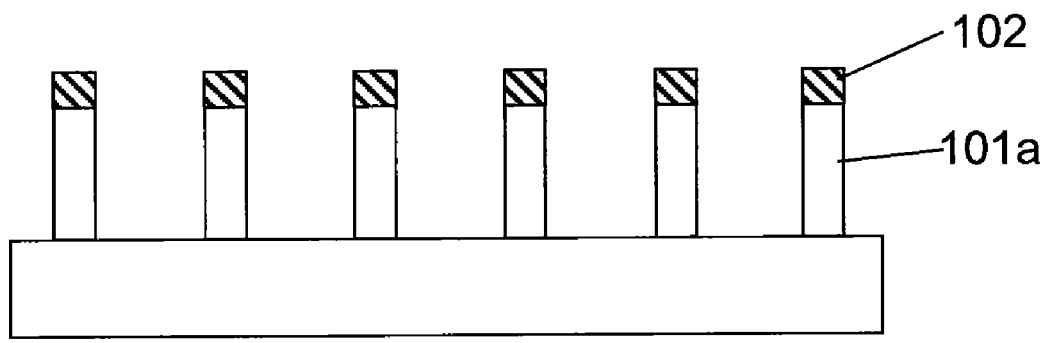
FIG. 6A is a cross-sectional view at the line A-A' in FIG. 5 showing a production method of Embodiment 1.
Figure 6B:
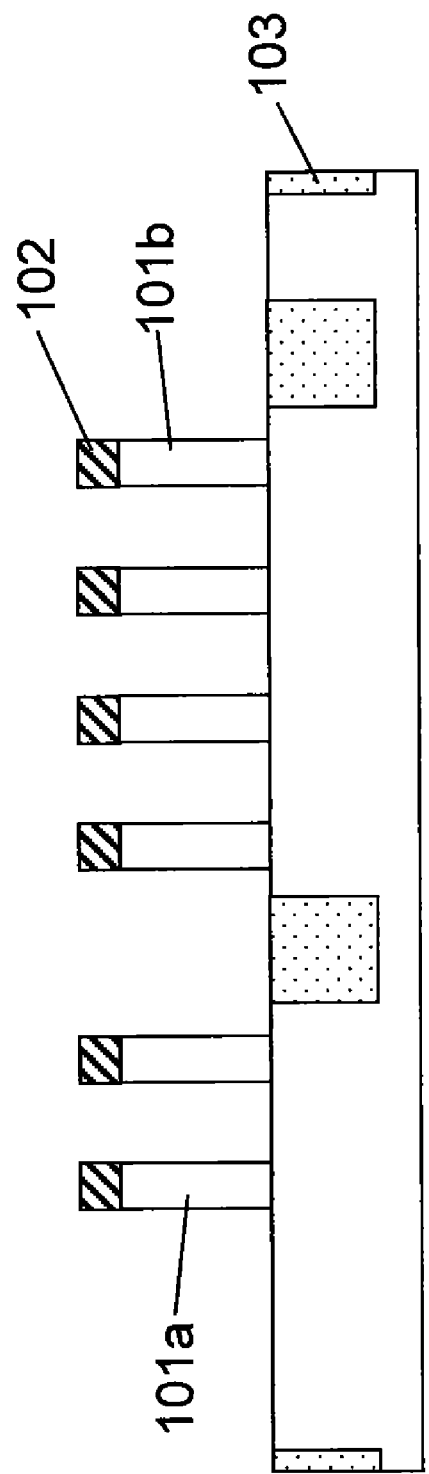
FIG. 6B is a cross-sectional view at the line B-B' in FIG. 5 showing a production method of Embodiment 1.

As shown in FIGS. 5, 6A, and 6B, element separation regions 103 are formed on the substrate in the boundary region between PMOS and NMOS regions, in regions where the input contacts 121 of the inverters in individual stages are formed, and in the boundary areas between this CMOS inverter and the surrounding area. The element separation regions 103 are formed, for example, as follows: i) element separation grooves are formed in regions of the substrate where element separation regions are to be formed by etching; ii) the groove pattern is filled with an oxide film by applying silica or by CVD (chemical vapor deposition); and iii) any extra oxide film is removed by dry or wet etching.

Figure 7:
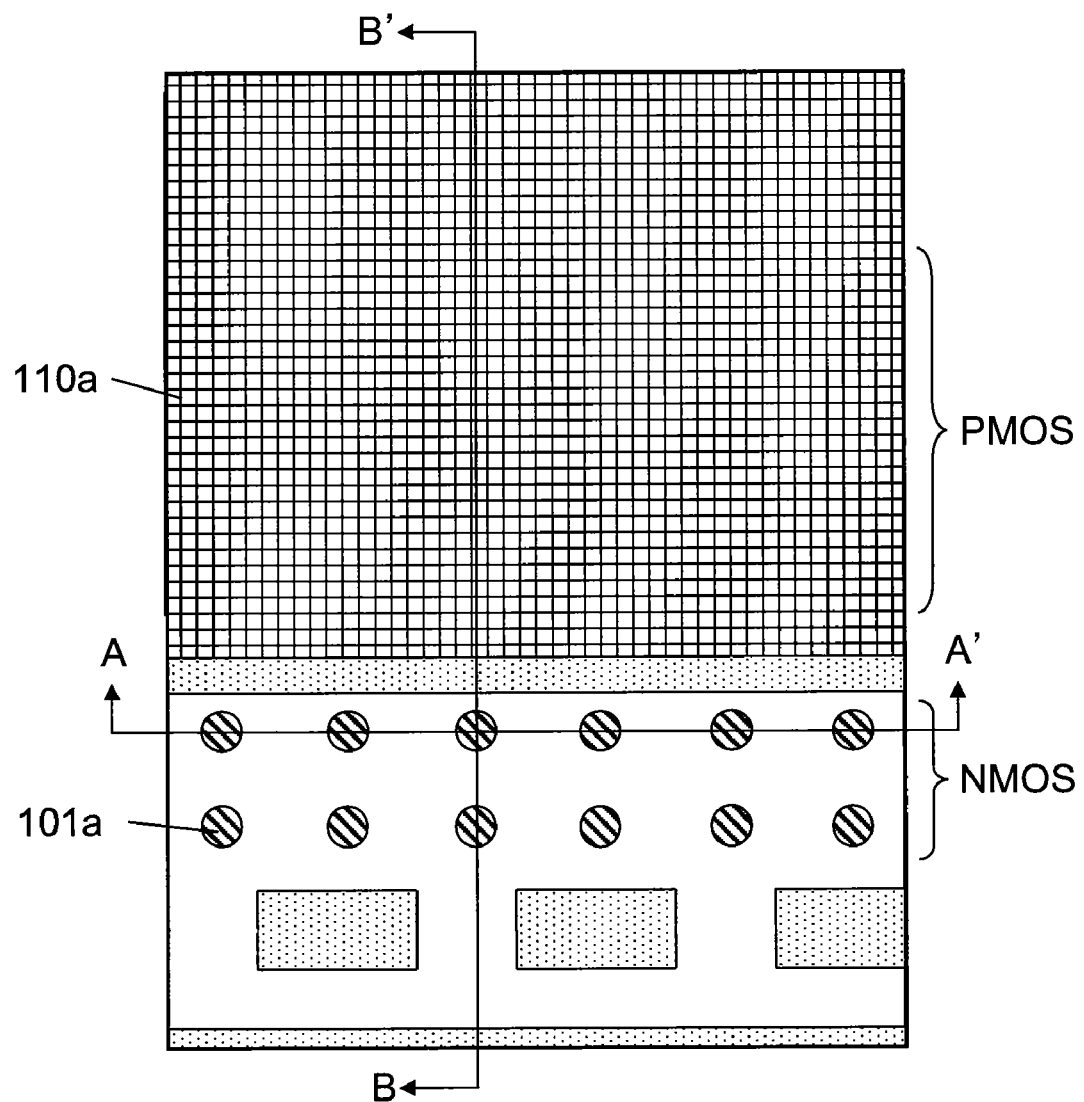
FIG. 7 is a plane view showing a production method of the semiconductor device according to Embodiment 1.
Figure 8A:
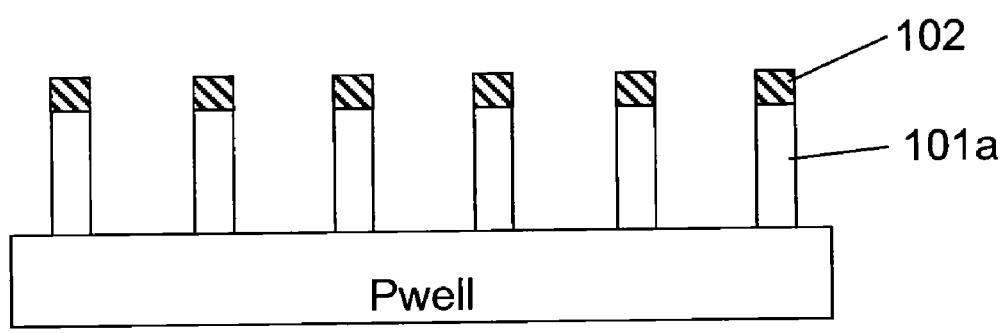
FIG. 8A is a cross-sectional view at the line A-A' in FIG. 7 showing a production method of Embodiment 1.
Figure 8B:
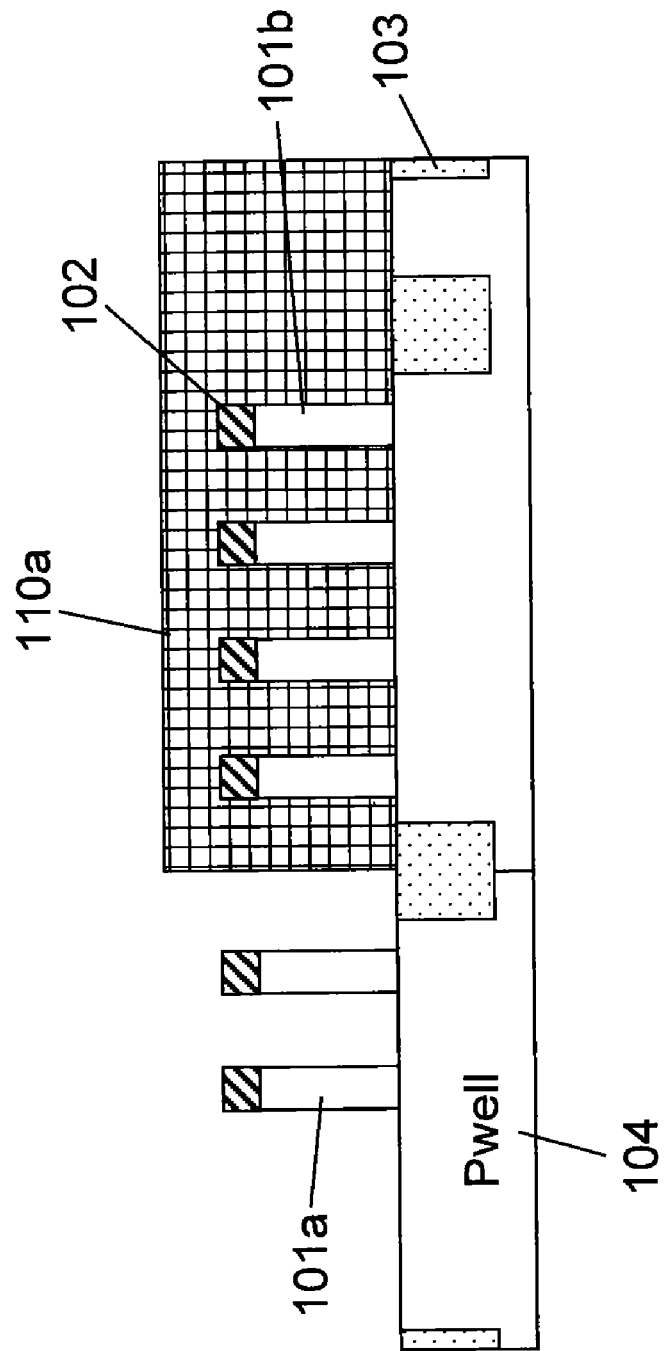
FIG. 8B is a cross-sectional view at the line B-B' in FIG. 7 showing a production method of Embodiment 1.

Then, as shown in FIGS. 7, 8A, and 8B, the PMOS region and its side are covered with a resist 110a and boron or the like is implanted in the exposed part of the substrate by ion implantation or the like to form a P well 104 in the NMOS region and its side.

Subsequently, the resist 110a is removed. The NMOS region and its side are covered with a resist and arsenic or the like is implanted in the exposed part of the substrate by ion implantation or the like to form an N well 105 in the PMOS region and its side.

Figure 9:
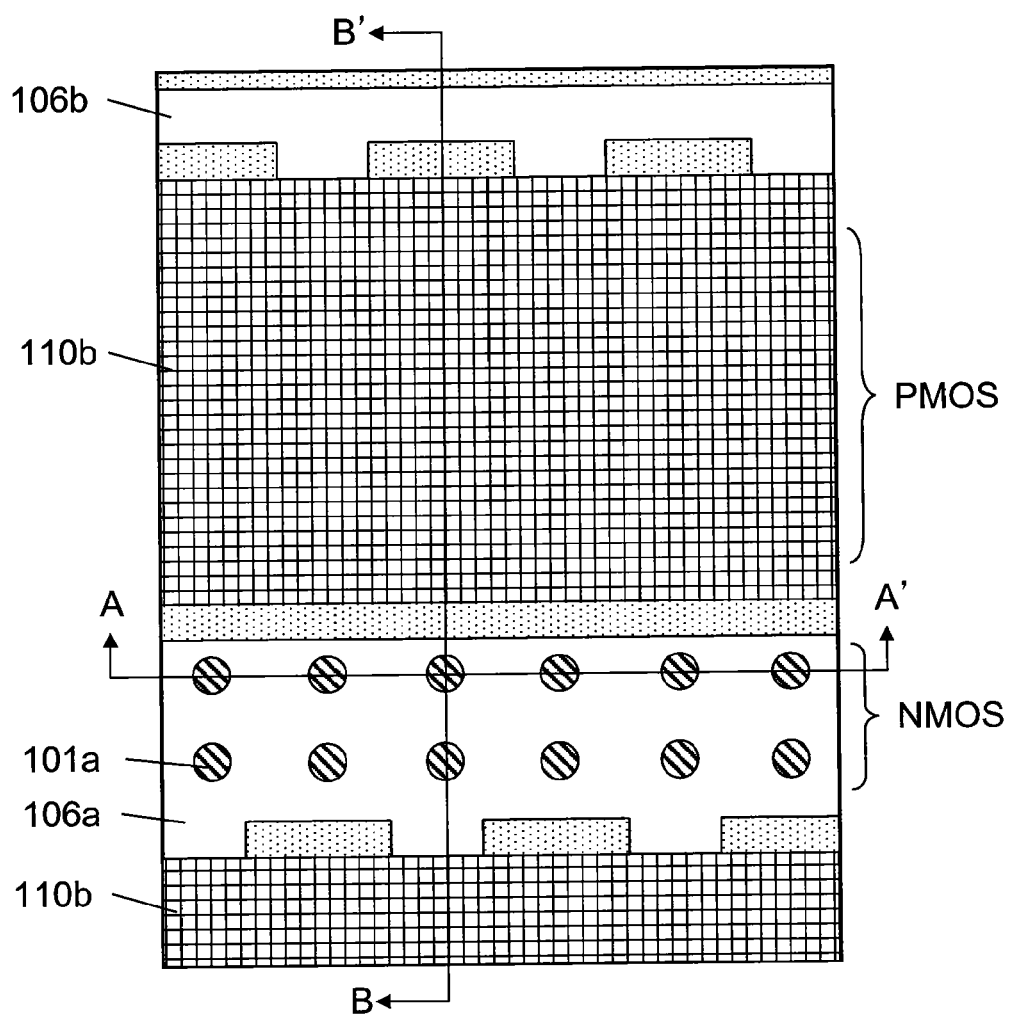
FIG. 9 is a plane view showing a production method of the semiconductor device according to Embodiment 1.
Figure 10A:
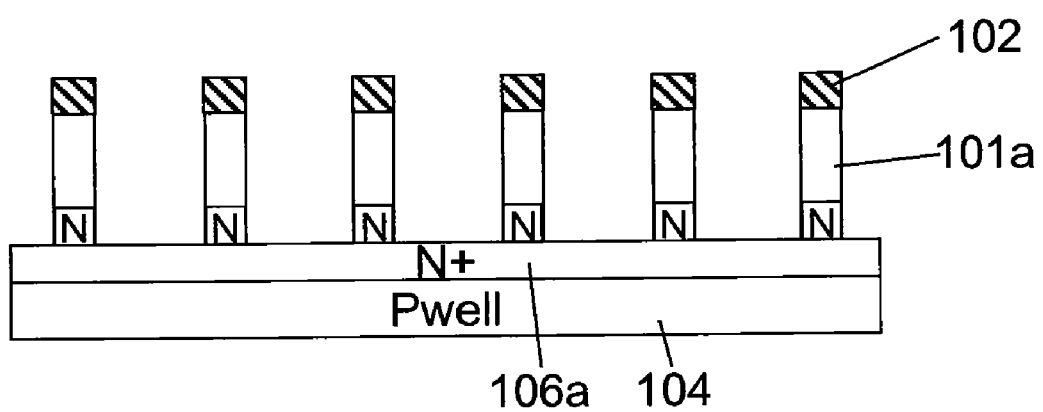
FIG. 10A is a cross-sectional view at the line A-A' in FIG. 9 showing a production method of Embodiment 1.
Figure 10B:
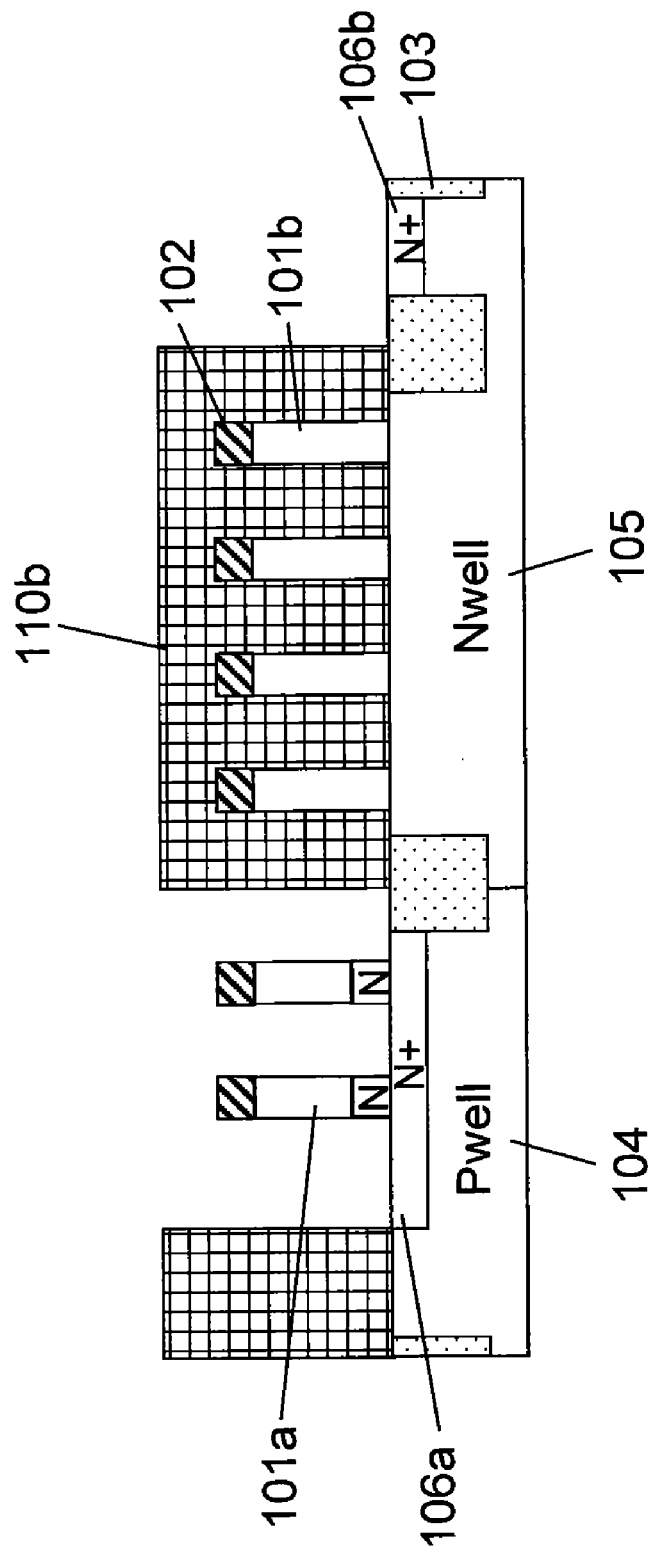
FIG. 10B is a cross-sectional view at the line B-B' in FIG. 9 showing a production method of Embodiment 1.

Subsequently, as shown in FIGS. 9, 10A, and 10B, the PMOS region, NMOS region, and their sides are covered with a resist 110b and arsenic or the like is implanted in the exposed part of the substrate by ion implantation or the like. Consequently, an N+ diffusion layer 106a is formed in the P well 104. Furthermore, an N+ diffusion layer 106b is also formed in the diffusion layer part for giving a potential to the N well 105.

Subsequently, the resist 110b is removed. The NMOS region, PMOS region, and their sides are covered with a resist and boron or the like is implanted in the exposed part of the substrate by ion implantation or the like. Consequently, a P+ diffusion layer 107a is formed in the N well 105. Furthermore, a P+ diffusion layer 107b is also formed in the diffusion layer part for giving a potential to the P well 104.

Furthermore, the N type impurity in the N+ diffusion layer 106a is diffused in the lower end part of the columnar silicon layer 101a, whereby the lower end part of the columnar silicon layer 101a becomes of an N type. Similarly, the P type impurity in the P+ diffusion layer 107a is diffused in the lower end part of the columnar silicon layer 101b, whereby the lower end part of the columnar silicon layer 101b becomes of a P type.

Figure 11:
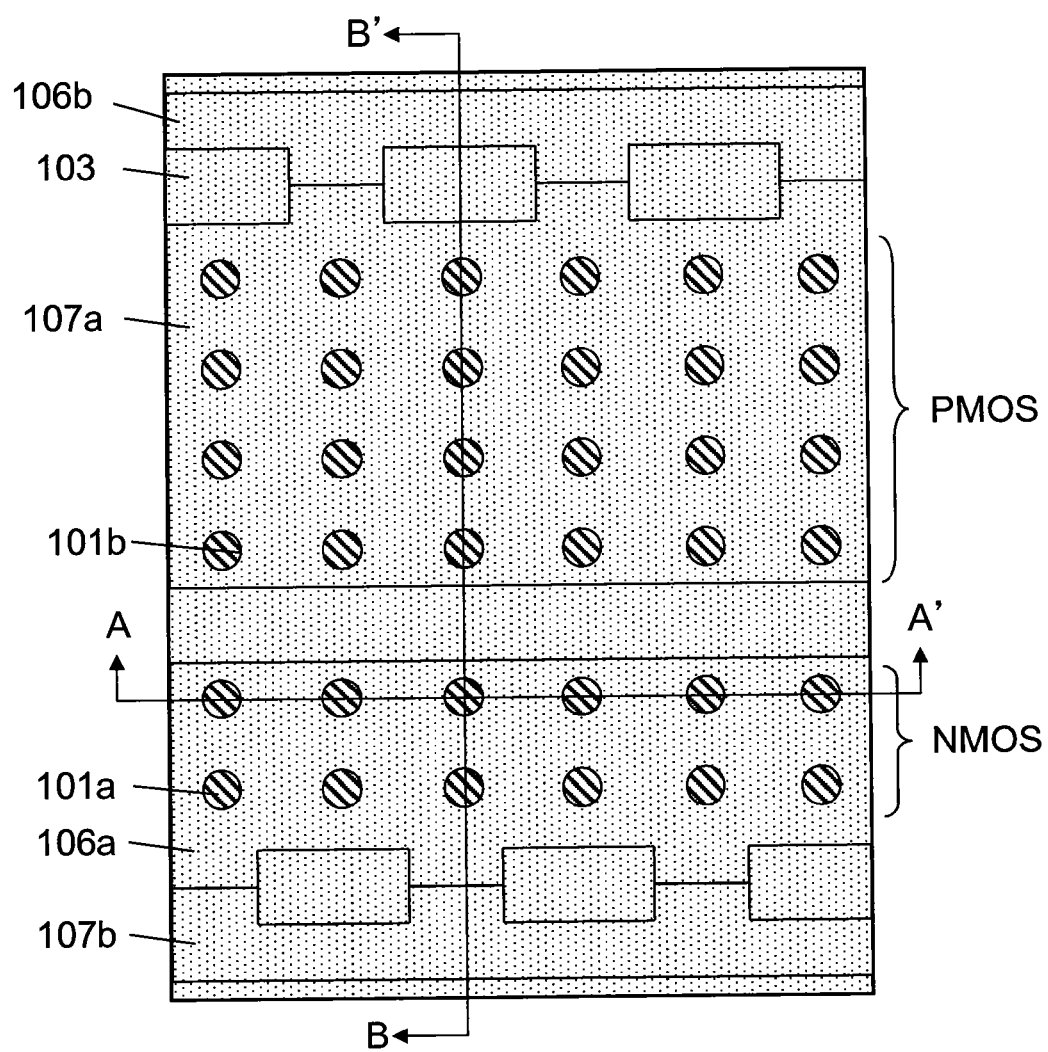
FIG. 11 is a plane view for explaining a production method of the semiconductor device according to Embodiment 1.
Figure 12A:
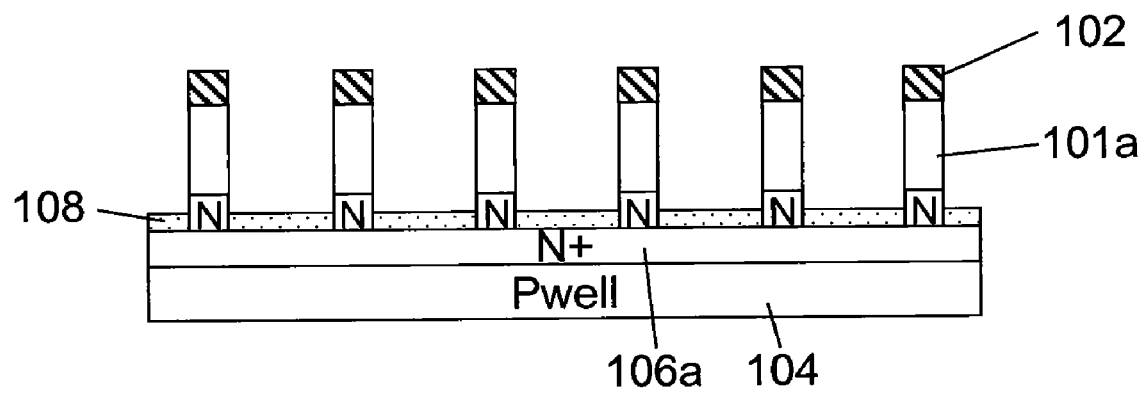
FIG. 12A is a cross-sectional view at the line A-A' in FIG. 11 for explaining a production method of Embodiment 1.
Figure 12B:
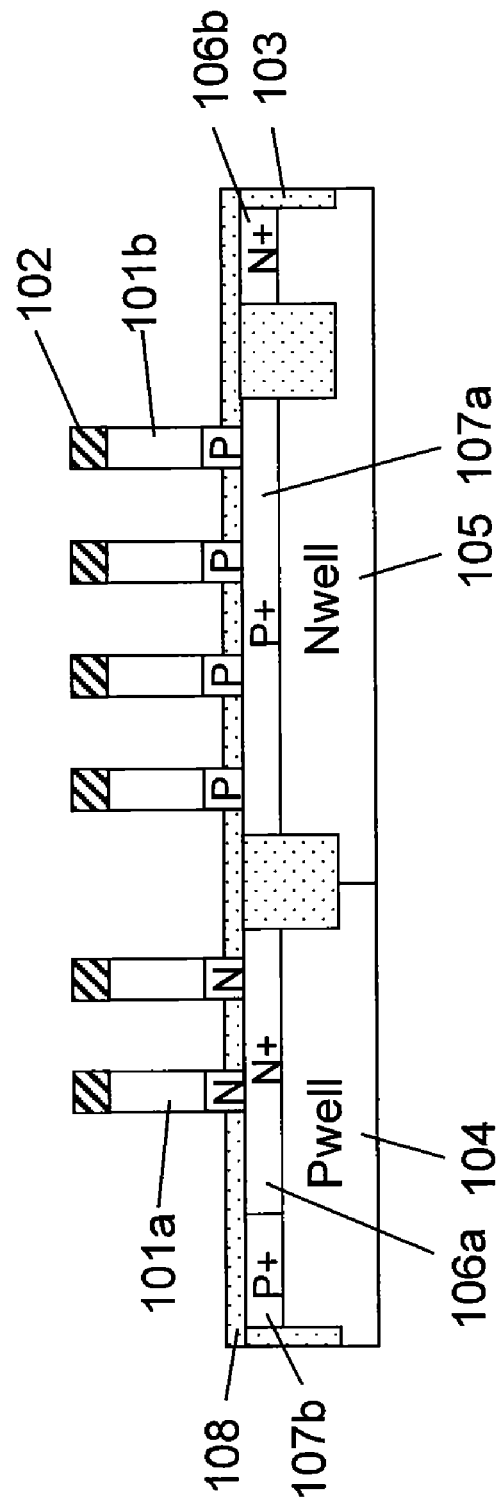
FIG. 12B is a cross-sectional view at the line B-B' in FIG. 11 for explaining a production method of Embodiment 1.

Then, as shown in FIGS. 11, 12A, and 12B, an oxide film such as a plasma oxide film is formed on the surface of the substrate. Subsequently, the oxide film is etched back by dry or wet etching to form on the diffusion layer an oxide film 108 for reducing parasitic capacitance between the gate electrode and diffusion layer.

Figure 13:
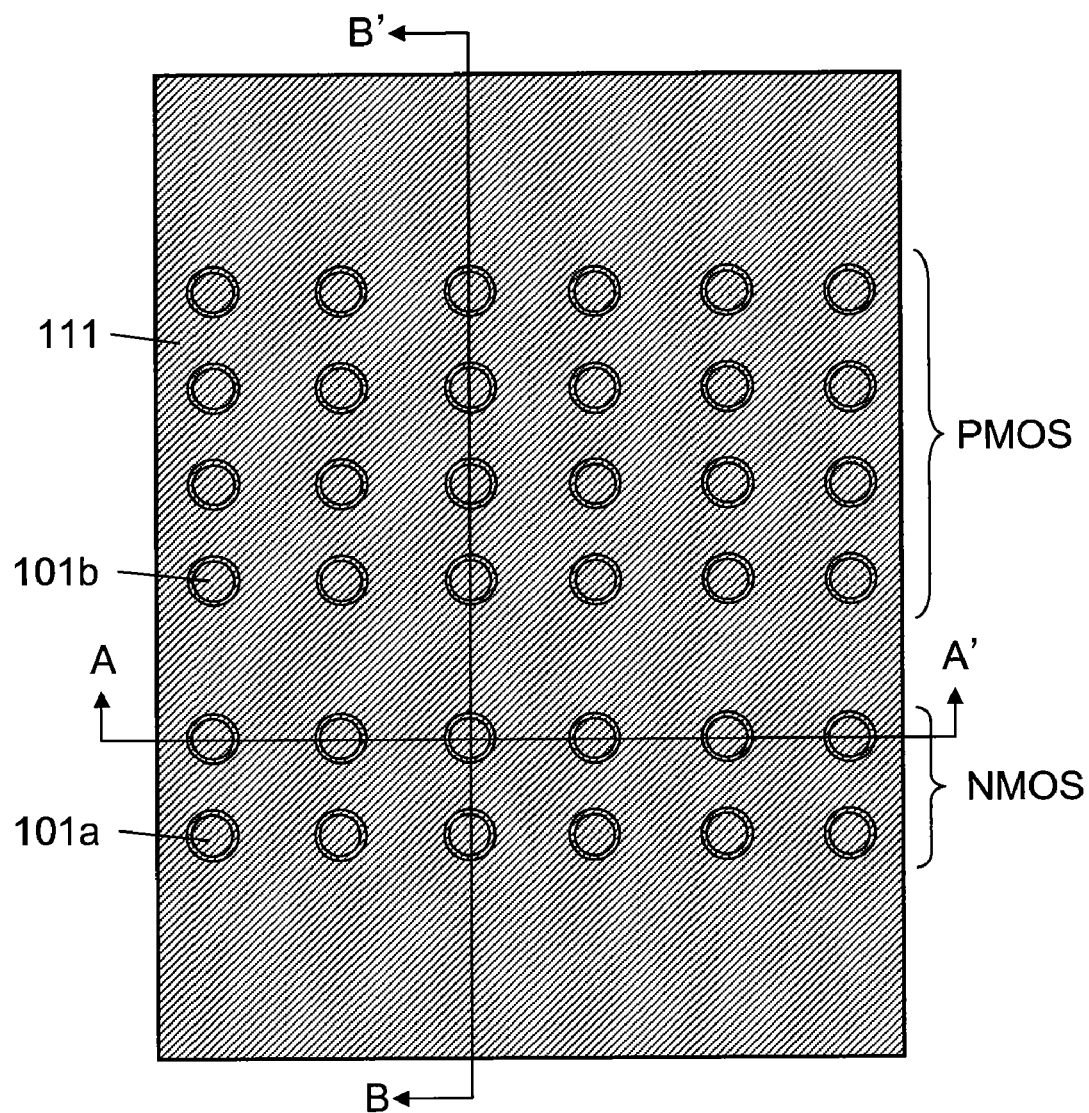
FIG. 13 is a plane view for explaining a production method of the semiconductor device according to Embodiment 1.
Figure 14A:
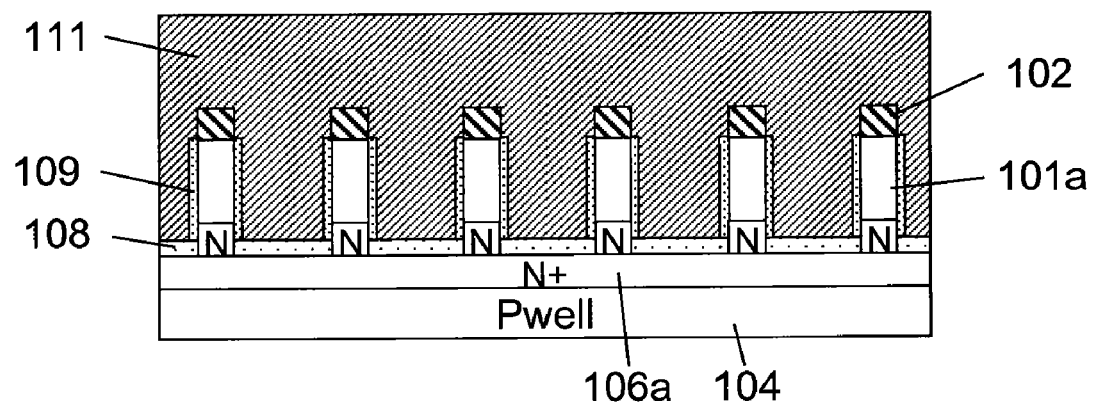
FIG. 14A is a cross-sectional view at the line A-A' in FIG. 13 for explaining a production method of Embodiment 1.
Figure 14B:
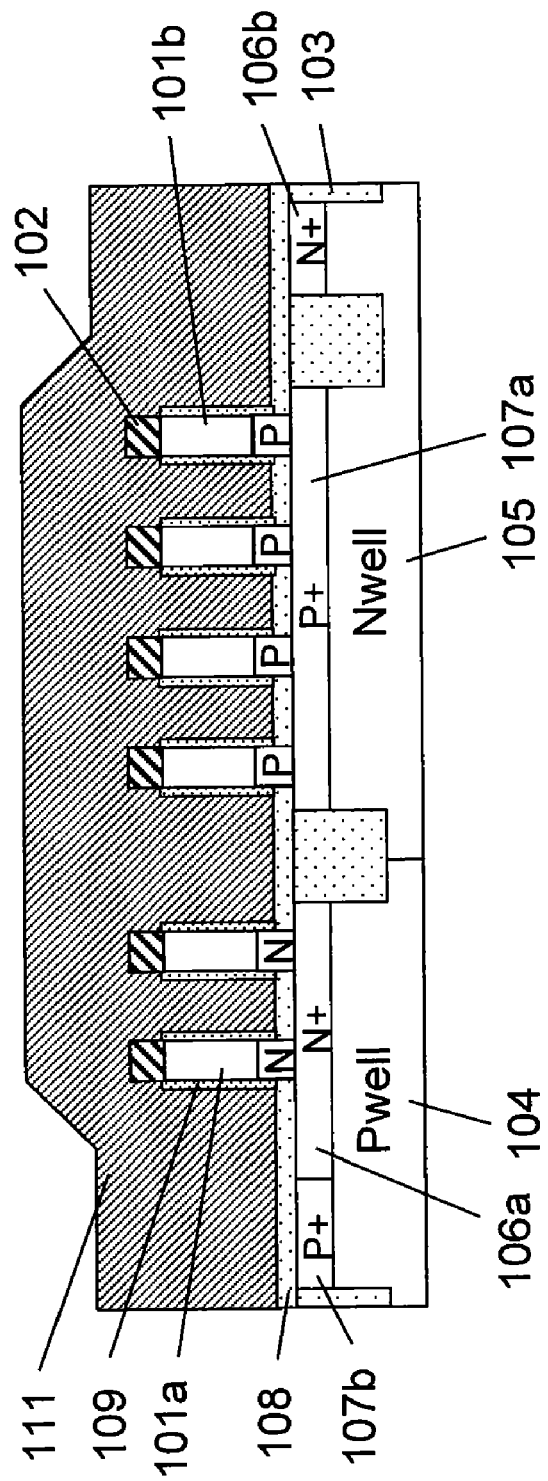
FIG. 14B is a cross-sectional view at the line B-B' in FIG. 13 for explaining a production method of Embodiment 1.

Then, as shown in FIGS. 13, 14A, and 14B, a gate insulating film 109 and gate conductive film 111 are formed. The gate insulating film 109 is formed by a silicon oxide film or a High-k (high dielectric constant) film such as a silicon nitride film. A silicon oxide film is formed, for example, by heating the substrate in an oxygen atmosphere to oxidize the surface of the columnar silicon layer. A High-k film is formed, for example, by CVD. The gate conductive film 111 is formed by a polysilicon film, metal film, or their lamination. These films are formed, for example, by CVD or sputtering.

Figure 15:
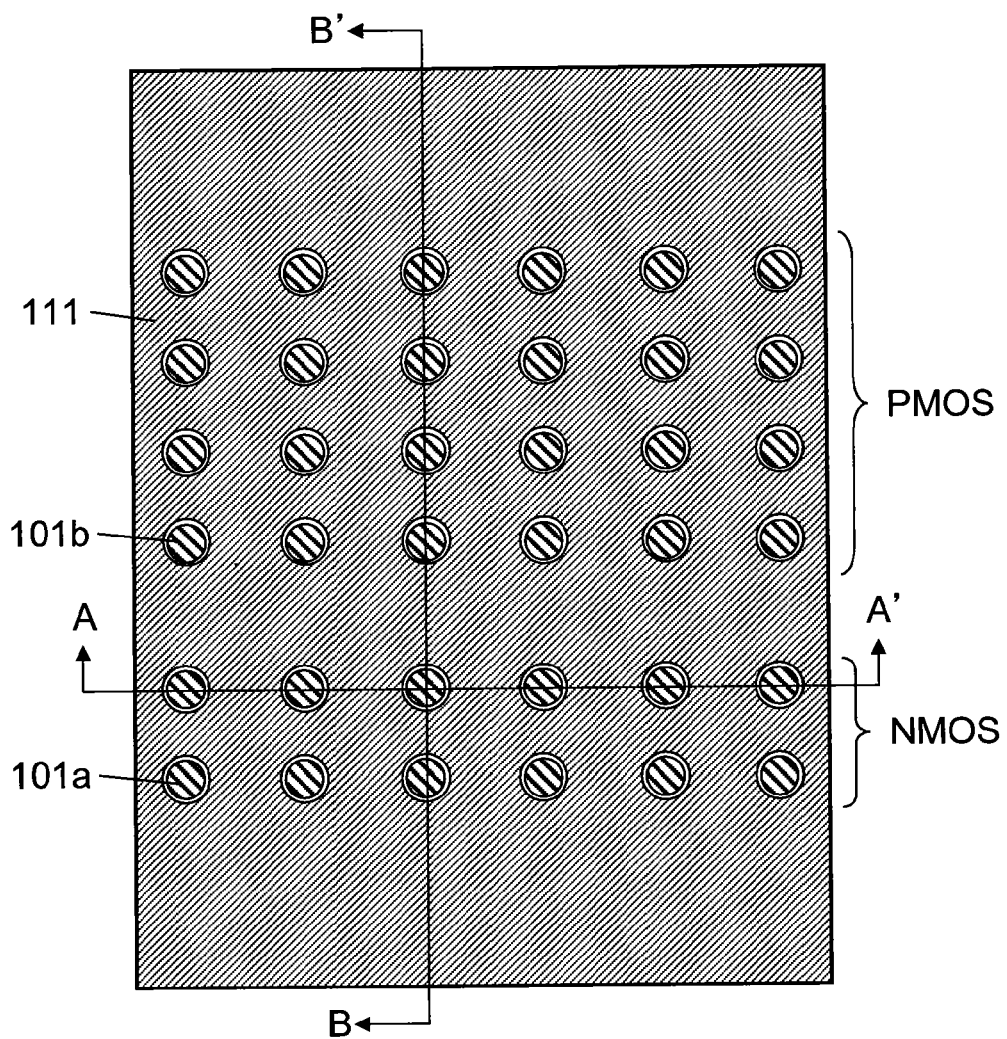
FIG. 15 is a plane view for explaining a production method of the semiconductor device according to Embodiment 1.
Figure 16A:
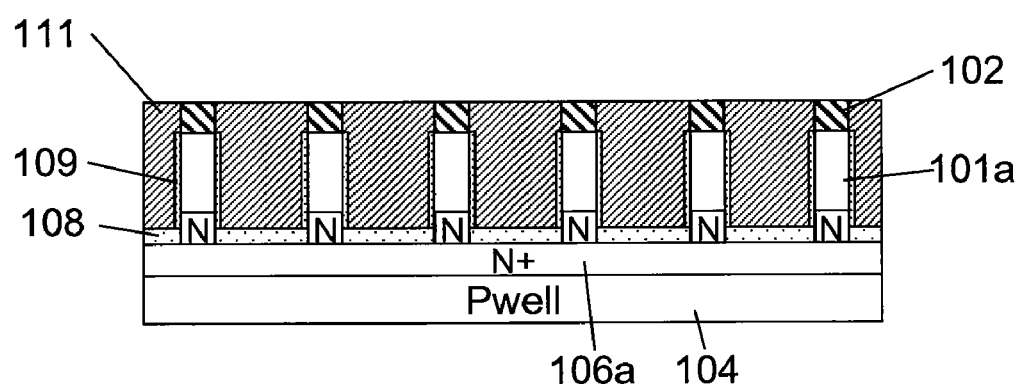
FIG. 16A is a cross-sectional view at the line A-A' in FIG. 15 for explaining a production method of Embodiment 1.
Figure 16B:
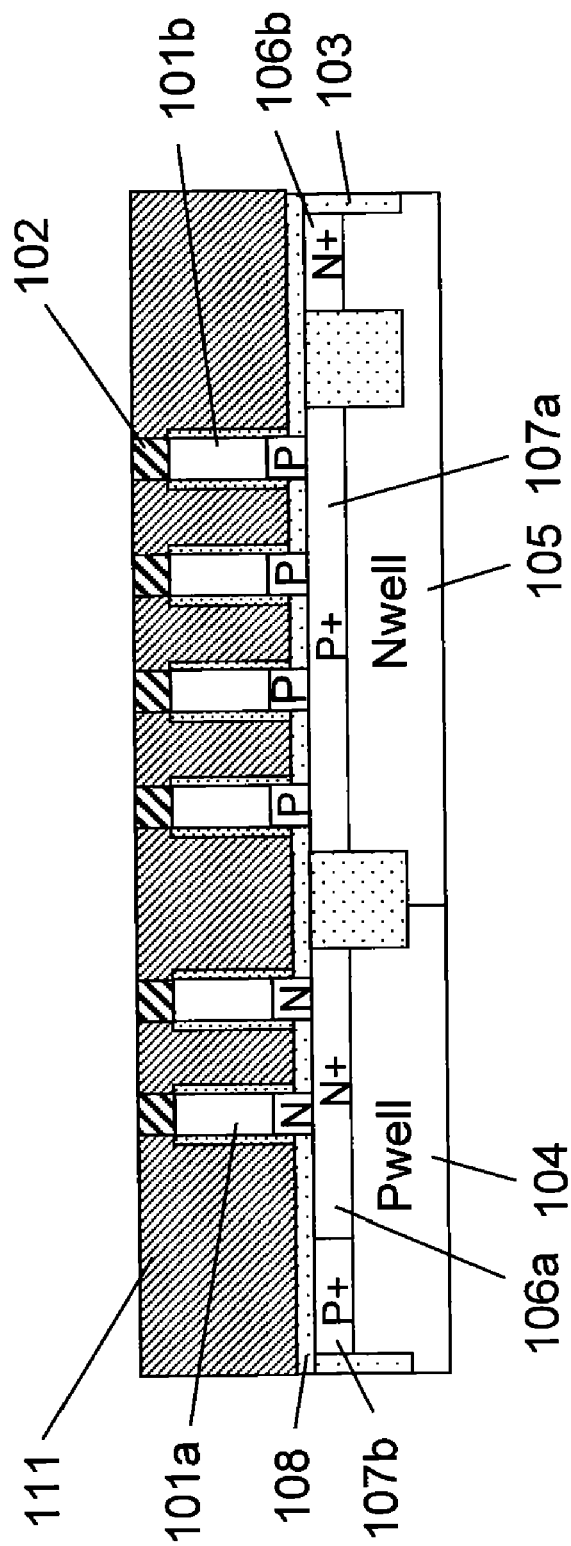
FIG. 16B is a cross-sectional view at the line B-B' in FIG. 15 for explaining a production method of Embodiment 1.

Then, as shown in FIGS. 15, 16A, and 16B, the gate conductive film 111 is flattened by CMP (chemical mechanical polishing) or the like using the hard mask layer 102 as the stopper.

Figure 17:
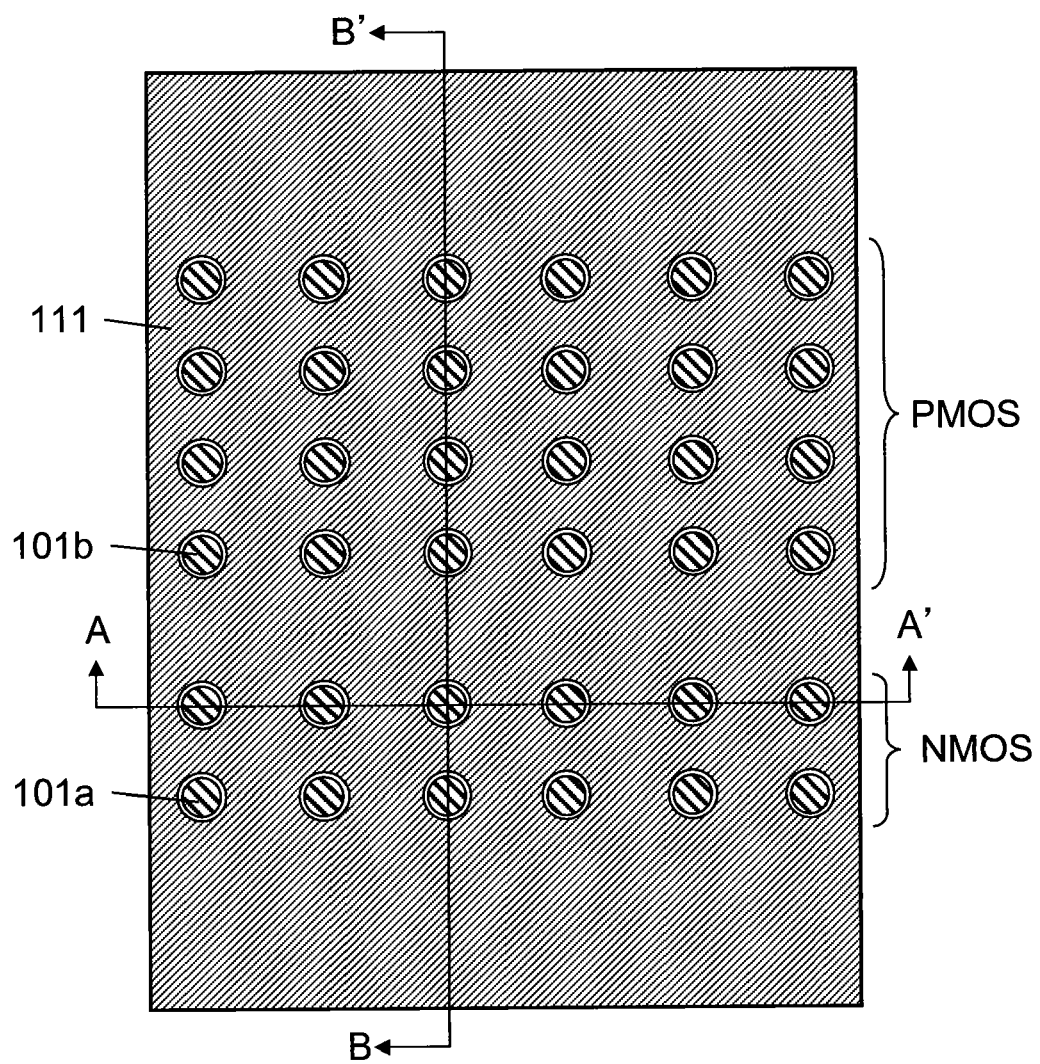
FIG. 17 is a plane view for explaining a production method of the semiconductor device according to Embodiment 1.
Figure 18A:
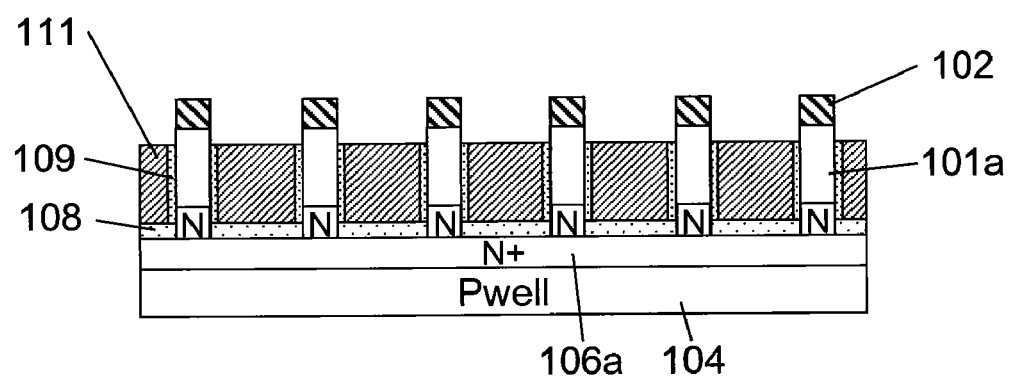
FIG. 18A is a cross-sectional view at the line A-A' in FIG. 17 for explaining a production method of Embodiment 1.
Figure 18B:
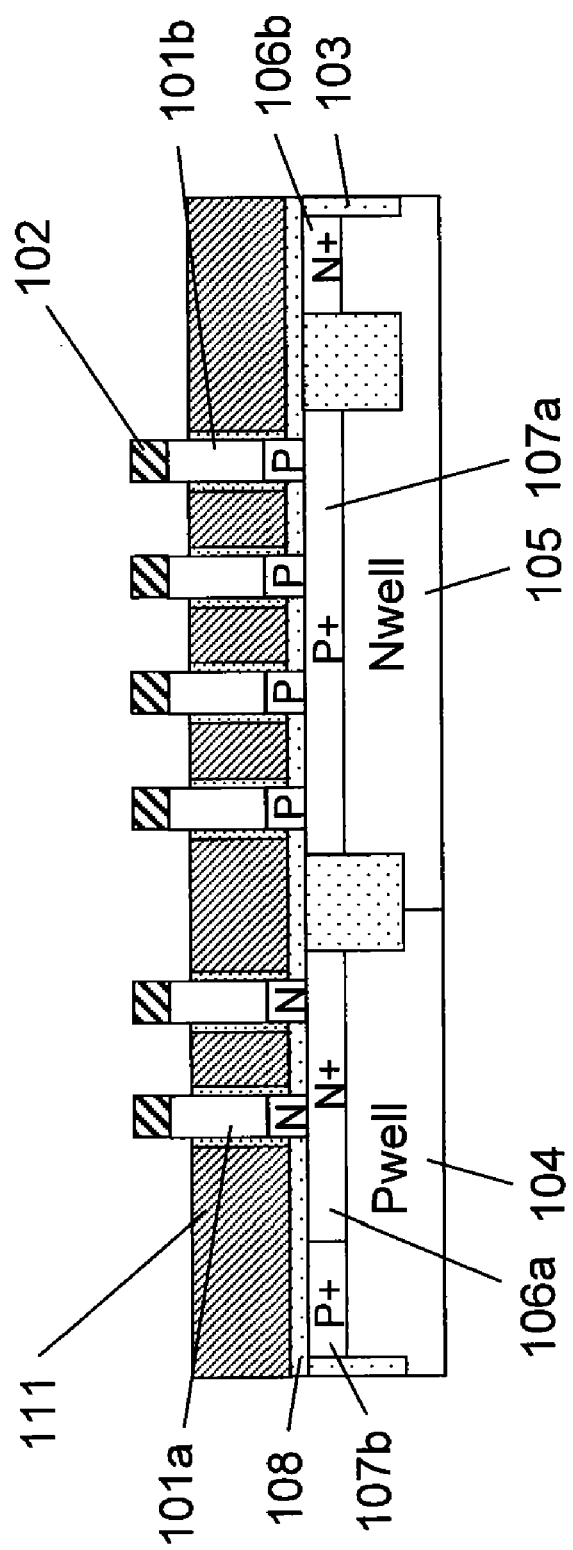
FIG. 18B is a cross-sectional view at the line B-B' in FIG. 17 for explaining a production method of Embodiment 1.

Subsequently, as shown in FIGS. 17, 18A, and 18B, the gate conductive film 111 is etched so that its thickness is equal to a desired gate length.

Figure 19:
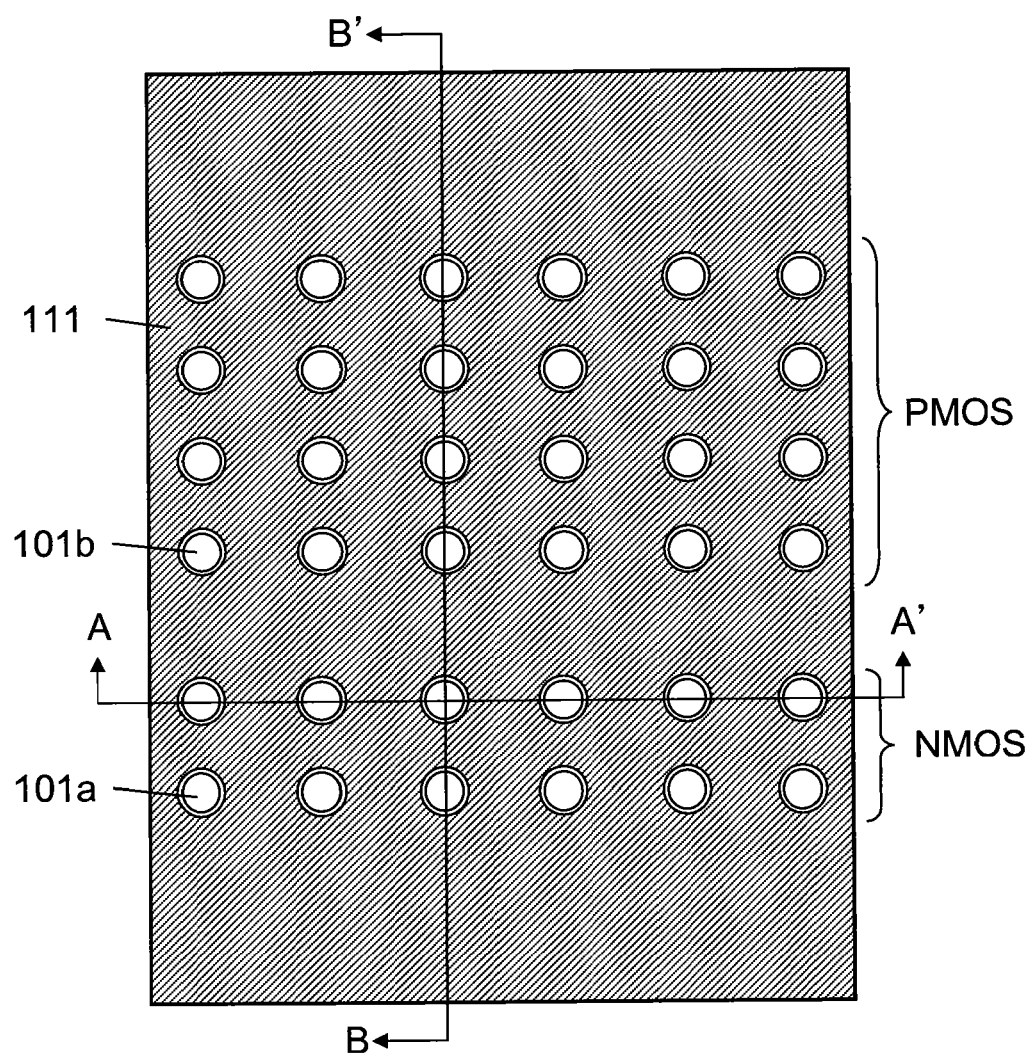
FIG. 19 is a plane view for explaining a production method of the semiconductor device according to Embodiment 1.
Figure 20A:
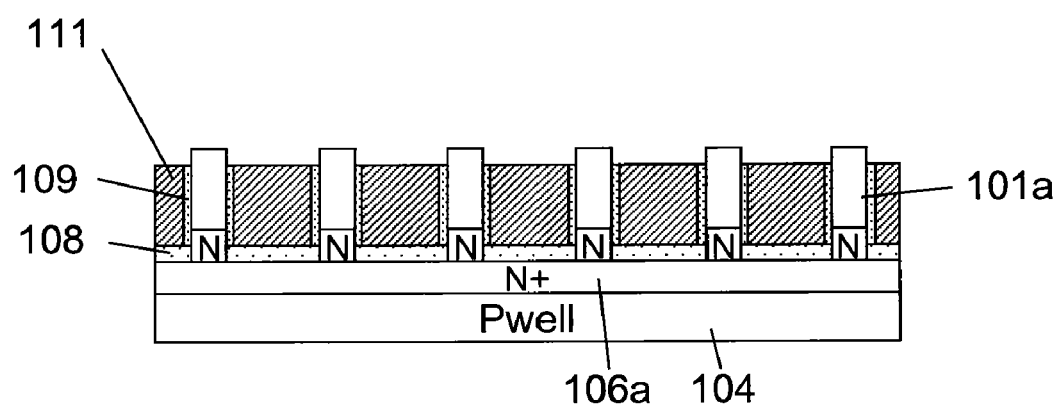
FIG. 20A is a cross-sectional view at the line A-A' in FIG. 19 for explaining a production method of Embodiment 1.
Figure 20B:
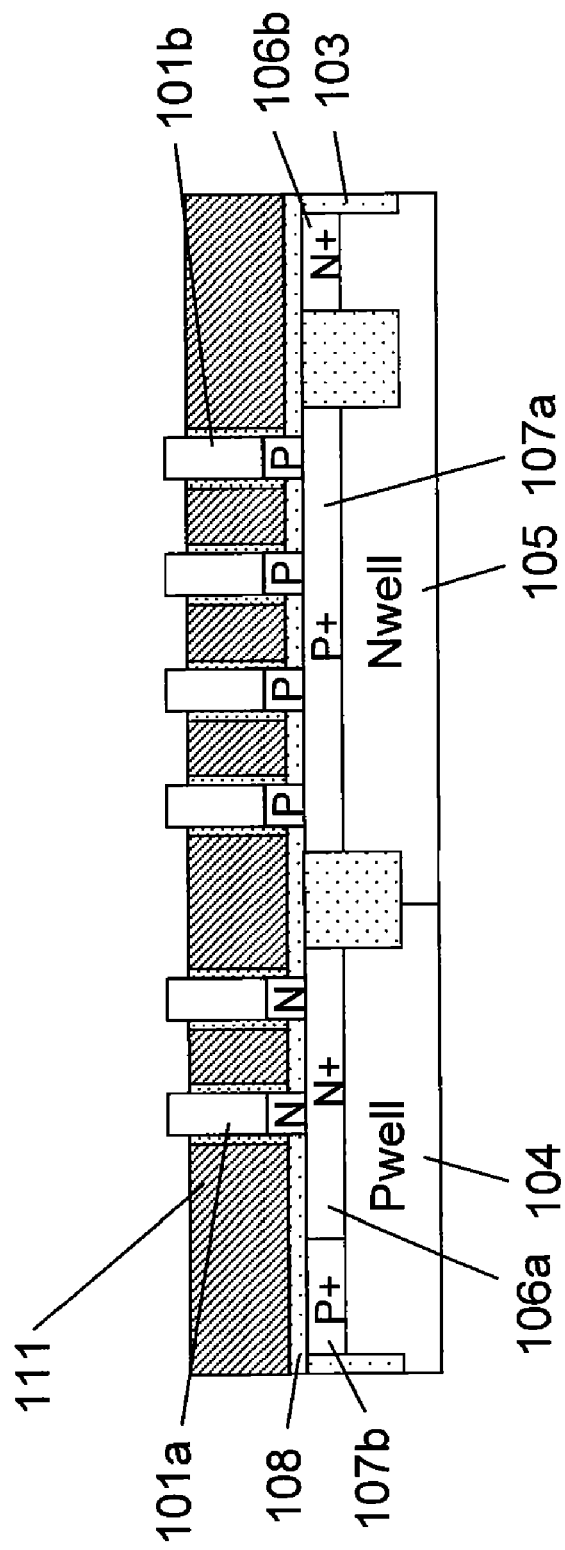
FIG. 20B is a cross-sectional view at the line B-B' in FIG. 19 for explaining a production method of Embodiment 1.

Then, as shown in FIGS. 19, 20A, and 20B, the hard mask layer 102 is removed by wet etching or the like.

Figure 21:
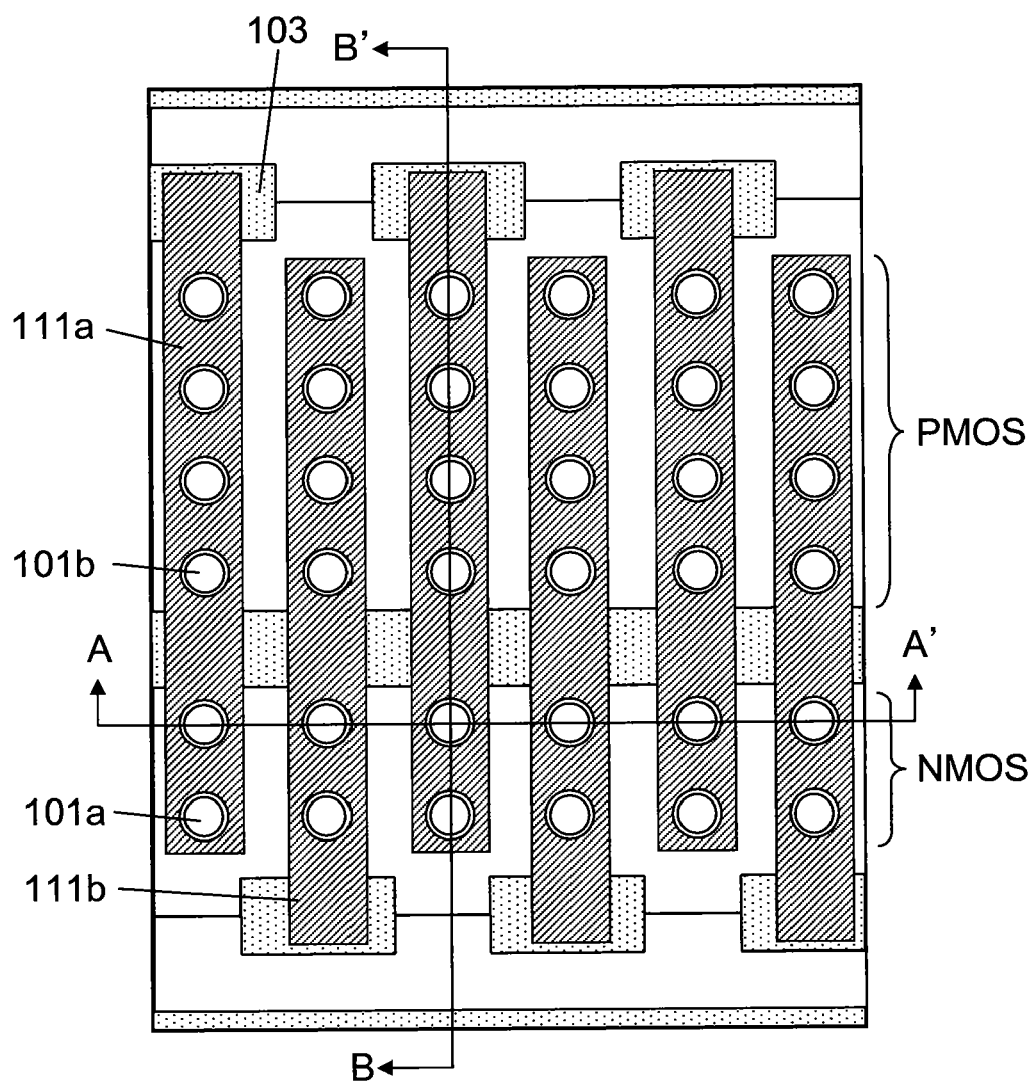
FIG. 21 is a plane view for explaining a production method of the semiconductor device according to Embodiment 1.
Figure 22A:
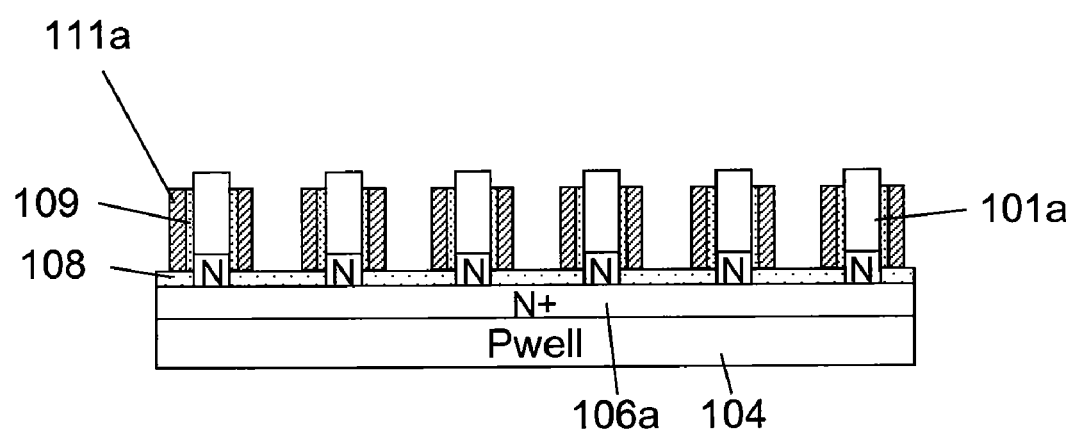
FIG. 22A is a cross-sectional view at the line A-A' in FIG. 21 for explaining a production method of Embodiment 1.
Figure 22B:
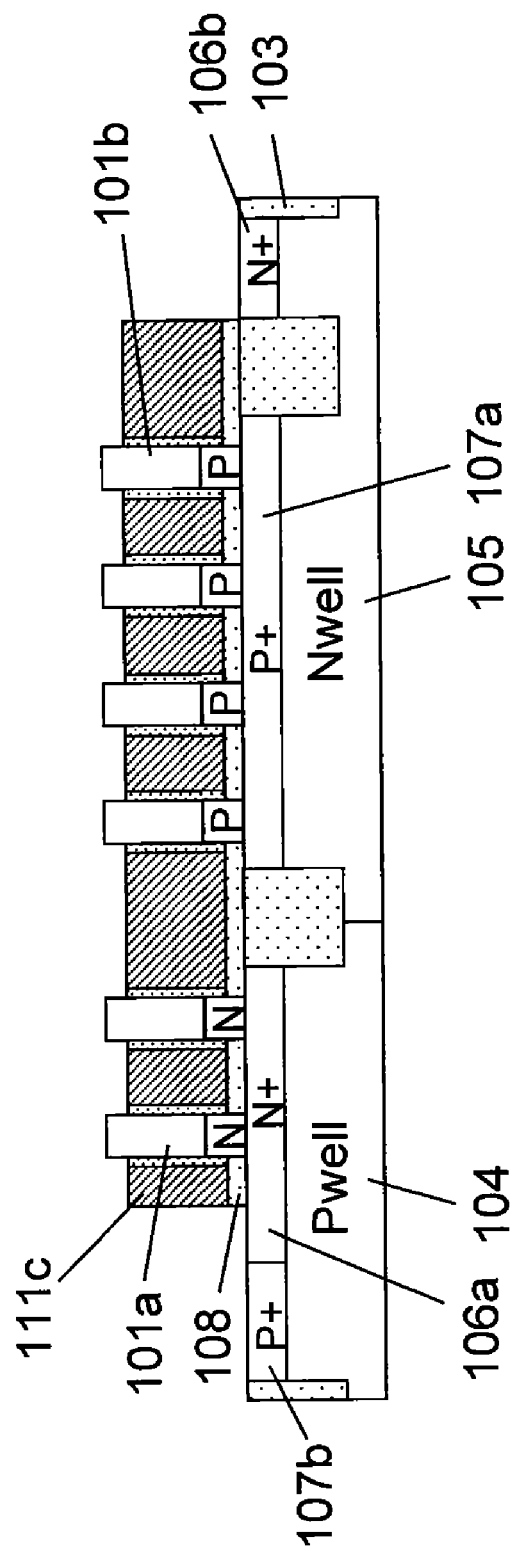
FIG. 22B is a cross-sectional view at the line B-B' in FIG. 21 for explaining a production method of Embodiment 1.

Then, as shown in FIGS. 21, 22A, and 22B, the gate conductive film 111 is patterned by lithography or the like to form gate wires 111a to 111f extending in the column direction of the matrix of columnar silicon layers.

Figure 23:
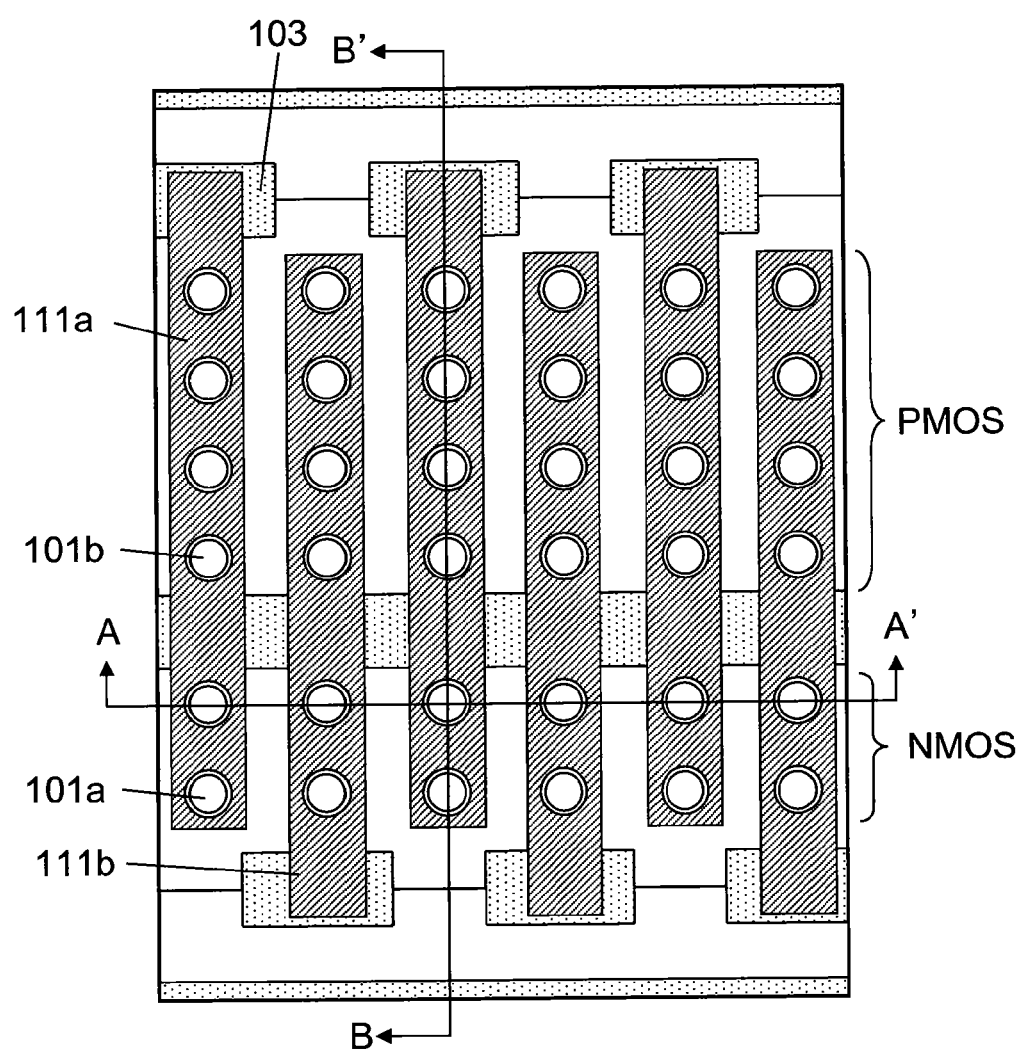
FIG. 23 is a plane view for explaining a production method of the semiconductor device according to Embodiment 1.
Figure 24A:
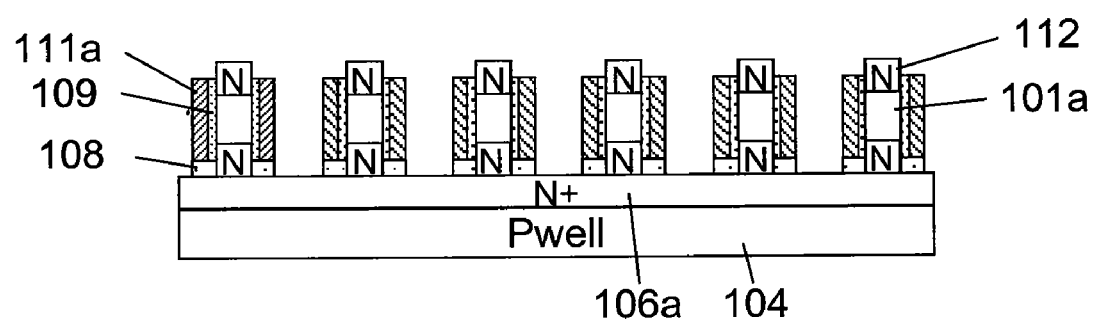
FIG. 24A is a cross-sectional view at the line A-A' in FIG. 23 for explaining a production method of Embodiment 1.
Figure 24B:
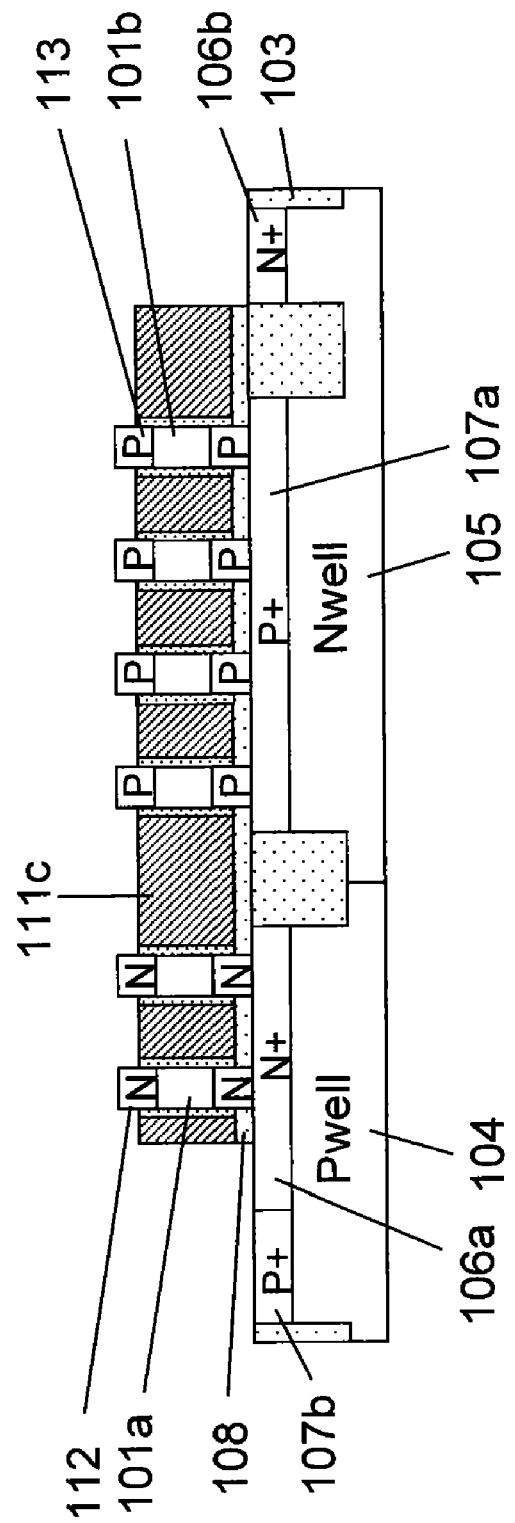
FIG. 24B is a cross-sectional view at the line B-B' in FIG. 23 for explaining a production method of Embodiment 1.

Then, as shown in FIGS. 23, 24A, and 24B, arsenic or the like is implanted in the NMOS region by ion implantation or the like, whereby arsenic is implanted also in the upper end part of the columnar silicon layer 101a. Consequently, an N+ upper diffusion layer 112 is formed in the upper end part of the columnar silicon layer 101a. Similarly, boron fluoride (BF2) or the like is implanted in the PMOS region by ion implantation or the like to form a P+ upper diffusion layer 113 in the upper end part of the columnar silicon layer 101b.

Figure 25:
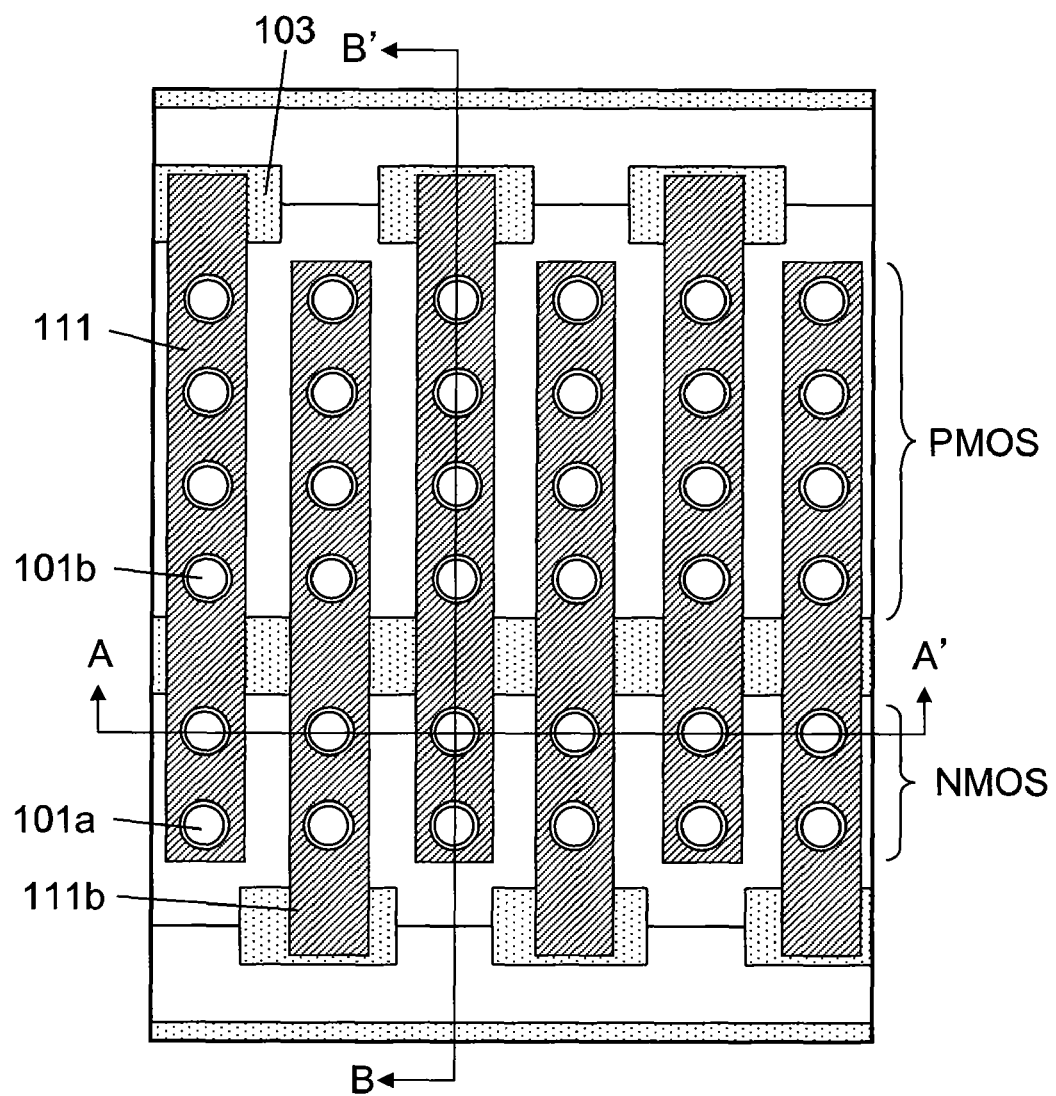
FIG. 25 is a plane view for explaining a production method of the semiconductor device according to Embodiment 1.
Figure 26A:
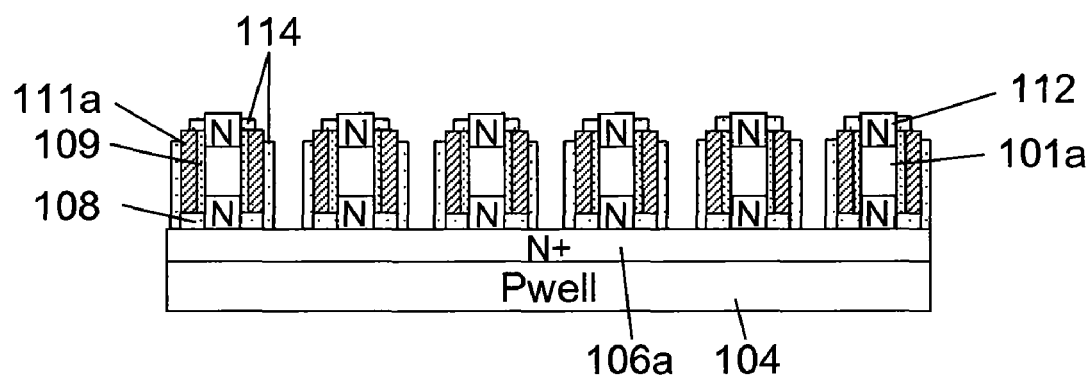
FIG. 26A is a cross-sectional view at the line A-A' in FIG. 25 for explaining a production method of Embodiment 1.
Figure 26B:
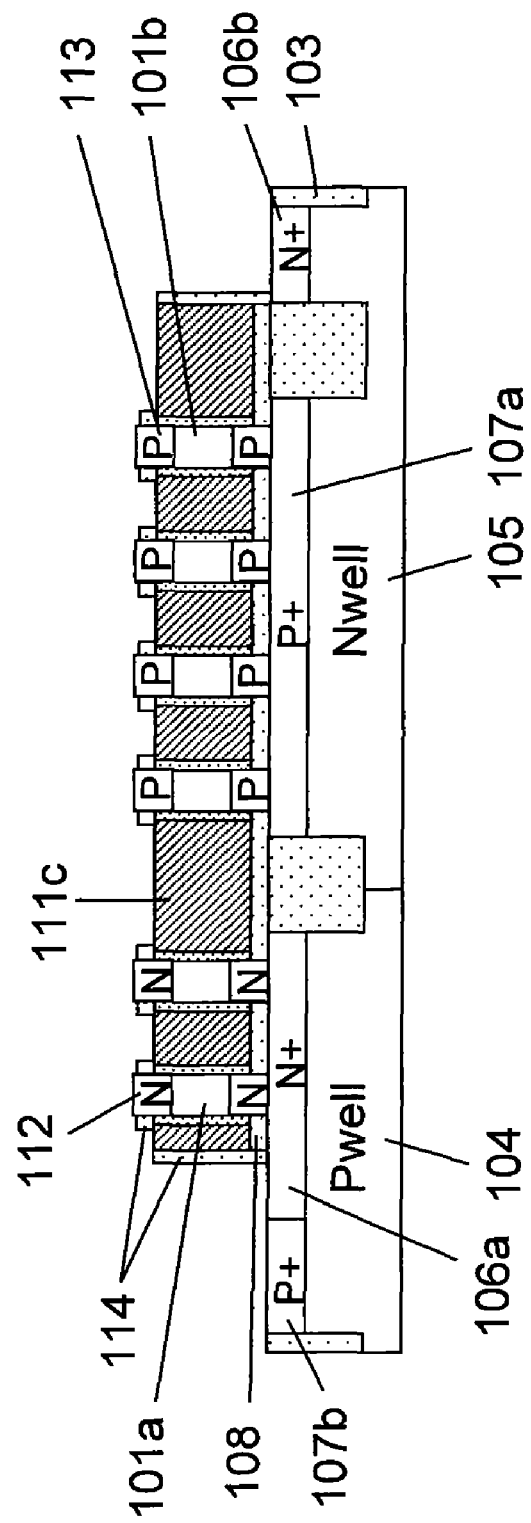
FIG. 26B is a cross-sectional view at the line B-B' in FIG. 25 for explaining a production method of Embodiment 1.

Then, as shown in FIGS. 25, 26A, and 26B, an insulating film such as an oxide film and nitride film is formed and etched back to form an insulating film sidewall 114 on the sidewall (exposed sidewall) of the upper end parts (N+ upper diffusion layer 112 and P+ upper diffusion layer 113) of the columnar silicon layers 101a and 101b and the sidewall (exposed sidewall) of the gate wires 111a to 111f. The insulating film sidewall 114 prevents short circuit between the upper end parts (N+ upper diffusion layer 112 and P+ upper diffusion layer 113) of the columnar silicon layers 101a and 101b and the upper end parts of the gate wires 111a to 111f that is caused by a silicide layer 116 formed in a subsequent step and short circuit between the sidewall of the gate wires 111a to 111f and the diffusion layer formed in the surface region of the substrate.

Figure 27:
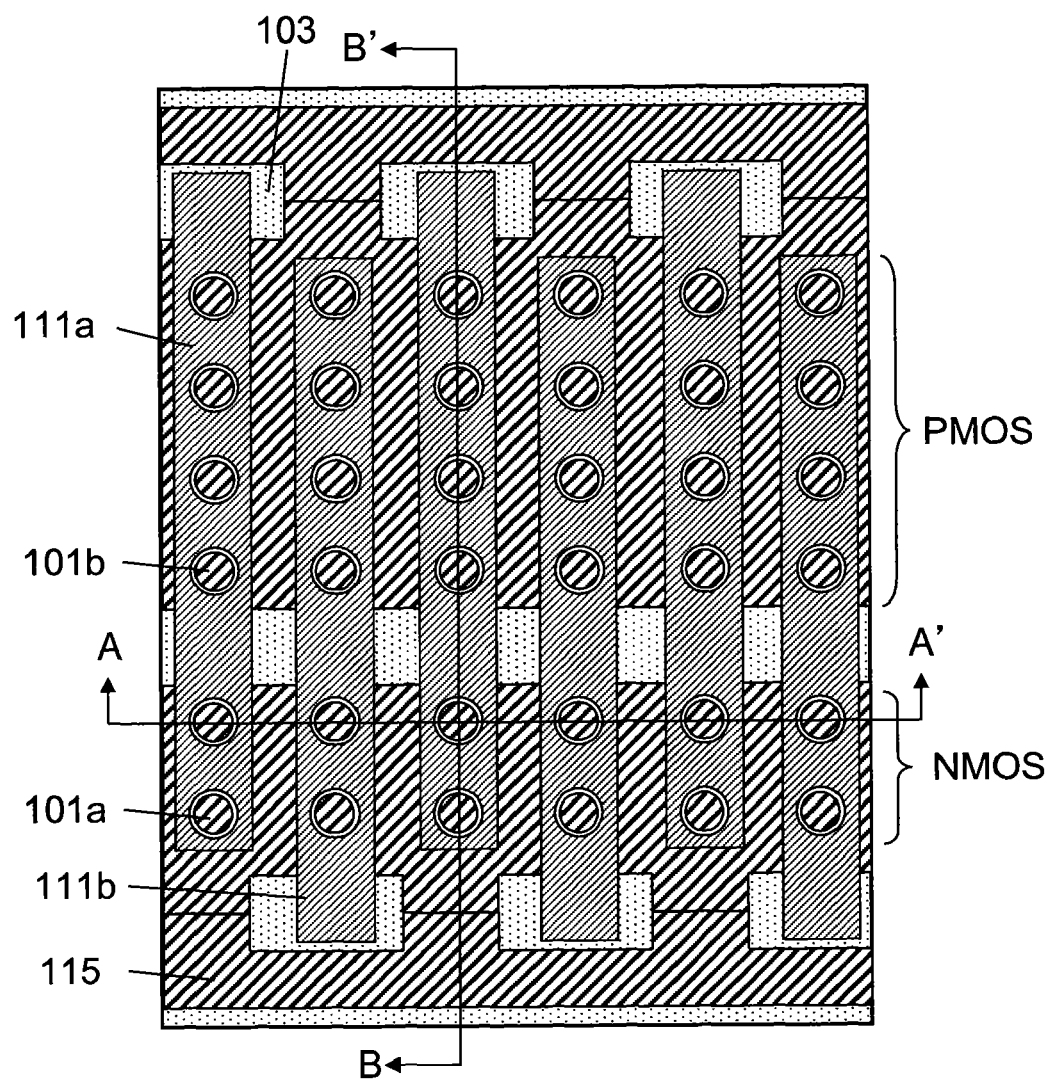
FIG. 27 is a plane view for explaining a production method of the semiconductor device according to Embodiment 1.
Figure 28A:
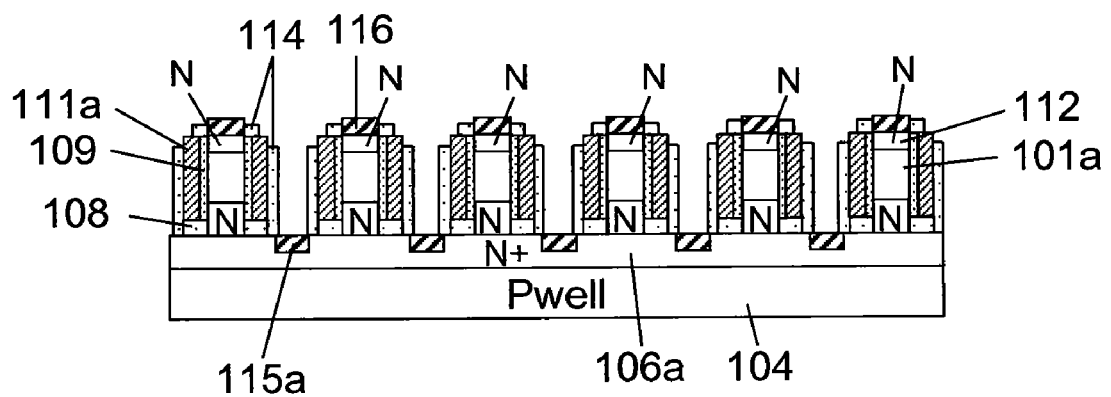
FIG. 28A is a cross-sectional view at the line A-A' in FIG. 27 for explaining a production method of Embodiment 1.
Figure 28B:
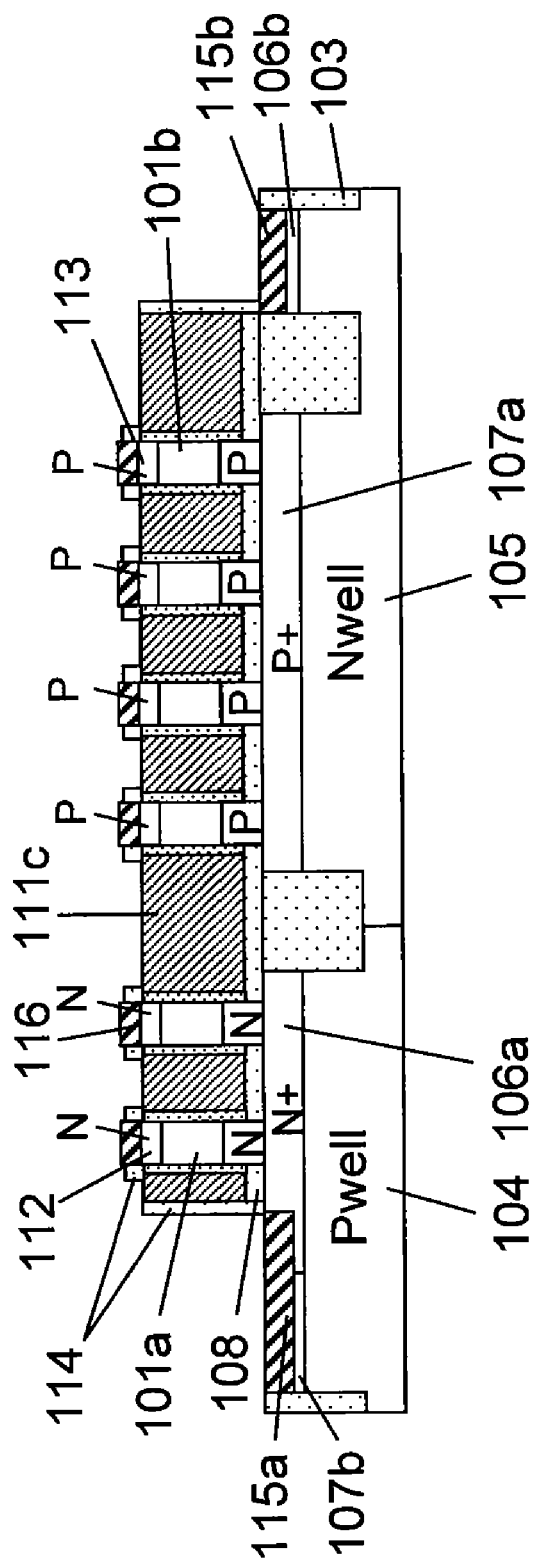
FIG. 28B is a cross-sectional view at the line B-B' in FIG. 27 for explaining a production method of Embodiment 1.

Then, as shown in FIGS. 27, 28A, and 28B, a metal such as Co and Ni is sputtered and heat-treated to selectively transform the diffusion layer (exposed part) to a silicide, whereby silicide layers 115a and 115b are formed on the exposed diffusion layer of the substrate and a silicide layer 116 is formed on the columnar silicon layers 101a and the columnar silicon layer 101b.

Figure 29:
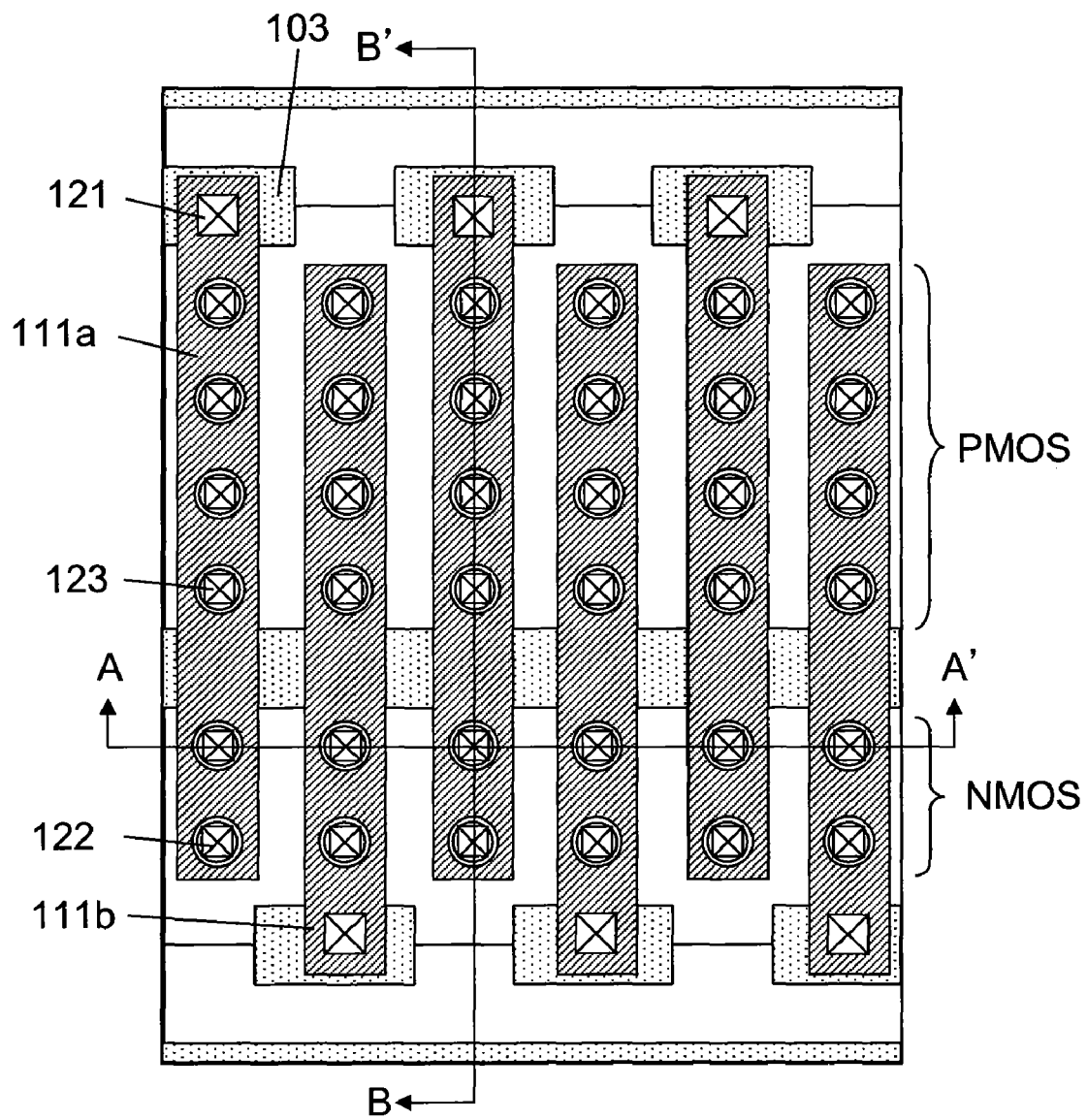
FIG. 29 is a plane view for explaining a production method of the semiconductor device according to Embodiment 1.
Figure 30A:
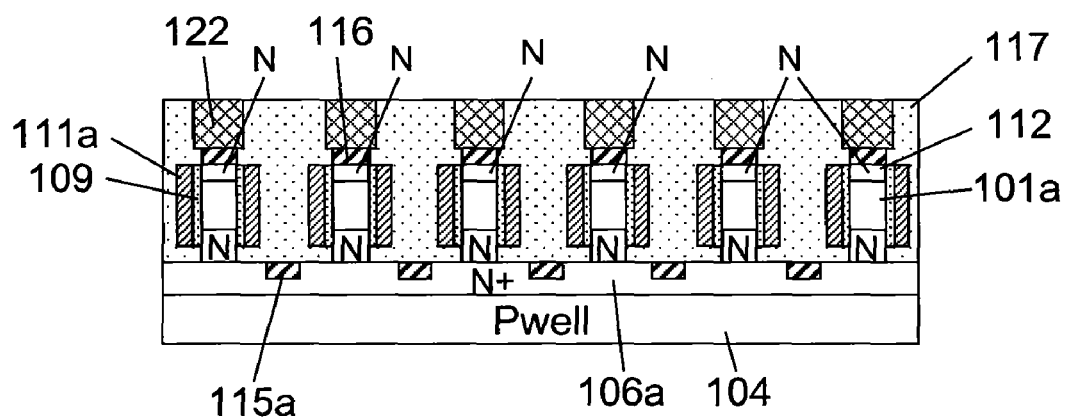
FIG. 30A is a cross-sectional view at the line A-A' in FIG. 29 for explaining a production method of Embodiment 1.
Figure 30B:
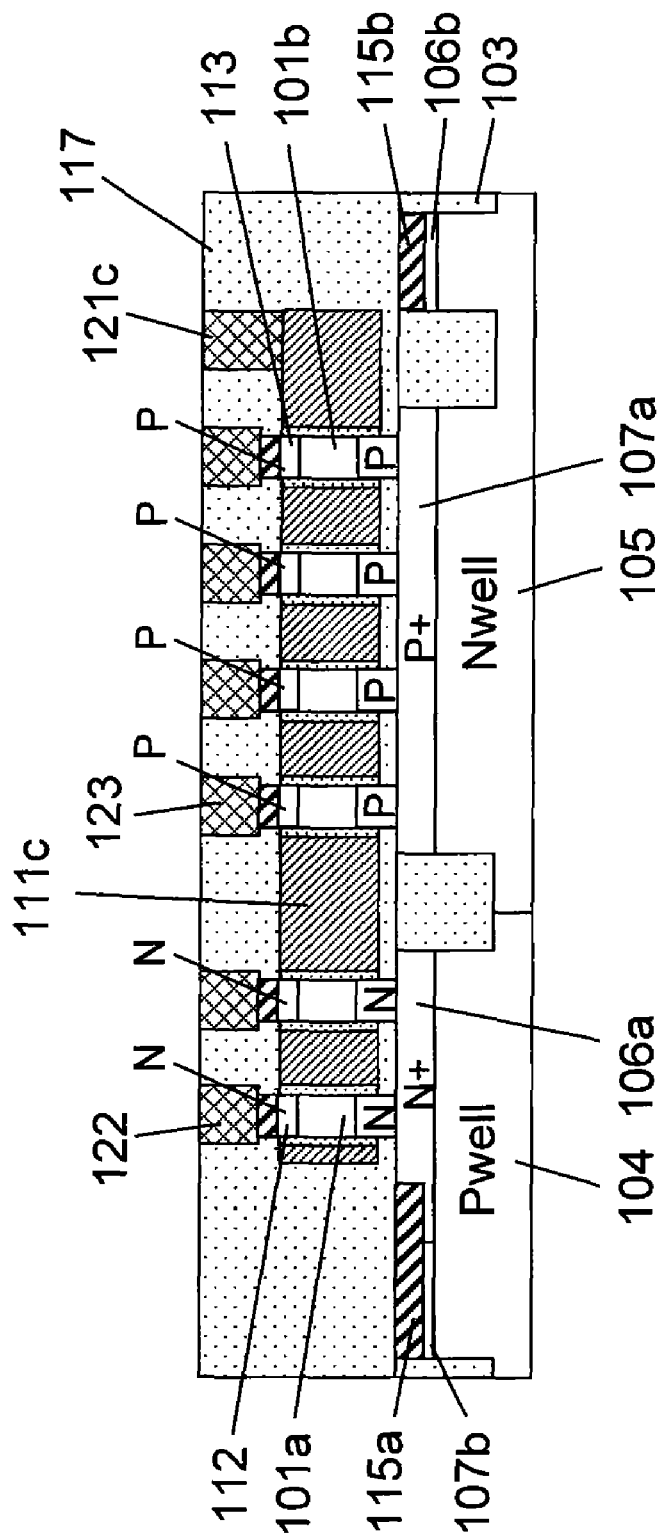
FIG. 30B is a cross-sectional view at the line B-B' in FIG. 29 for explaining a production method of Embodiment 1.

Then, as shown in FIGS. 29, 30A, and 30B, an interlayer film (insulating film) 117 is formed by an oxide film or the like. Subsequently, gate wire contacts 121a to 121f connected to the gate wires 111a to 111f, respectively, a columnar silicon layer contact 122 connected to the N+ upper diffusion layer 112 via the silicide layer 116, and a columnar silicon layer contact 123 connected to the P+ upper diffusion layer 113 via the silicide layer 116 are formed.

Figure 31:
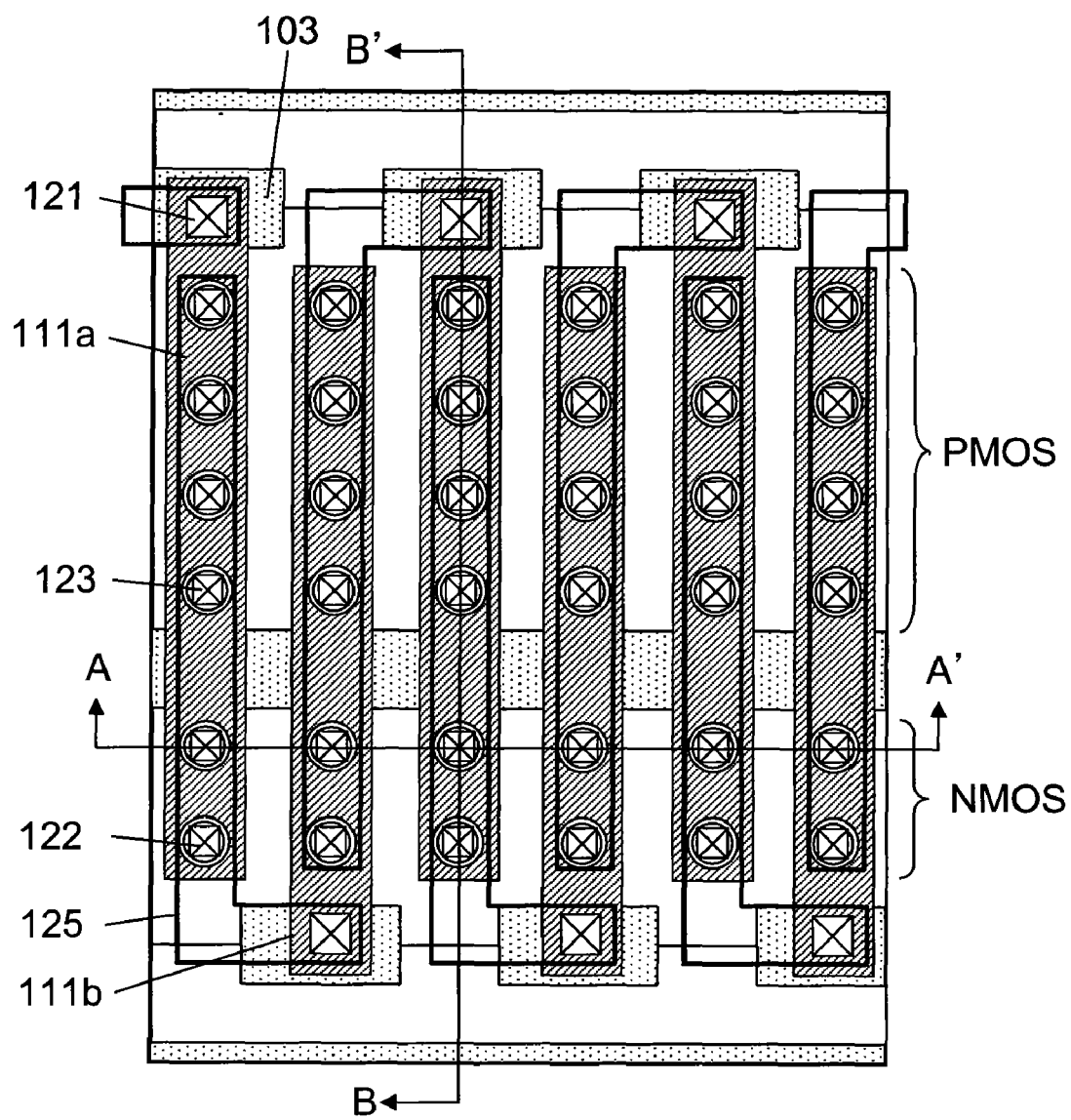
FIG. 31 is a plane view for explaining a production method of the semiconductor device according to Embodiment 1.
Figure 32A:
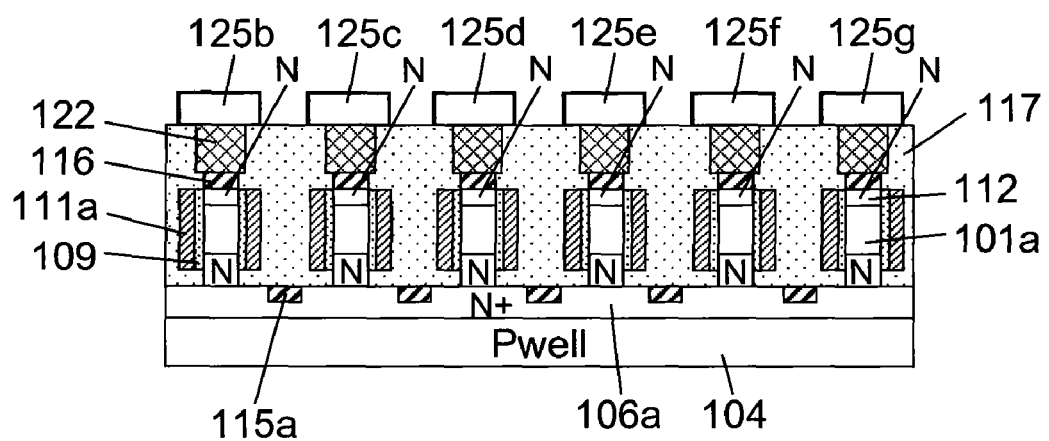
FIG. 32A is a cross-sectional view at the line A-A' in FIG. 31 for explaining a production method of Embodiment 1.
Figure 32B:
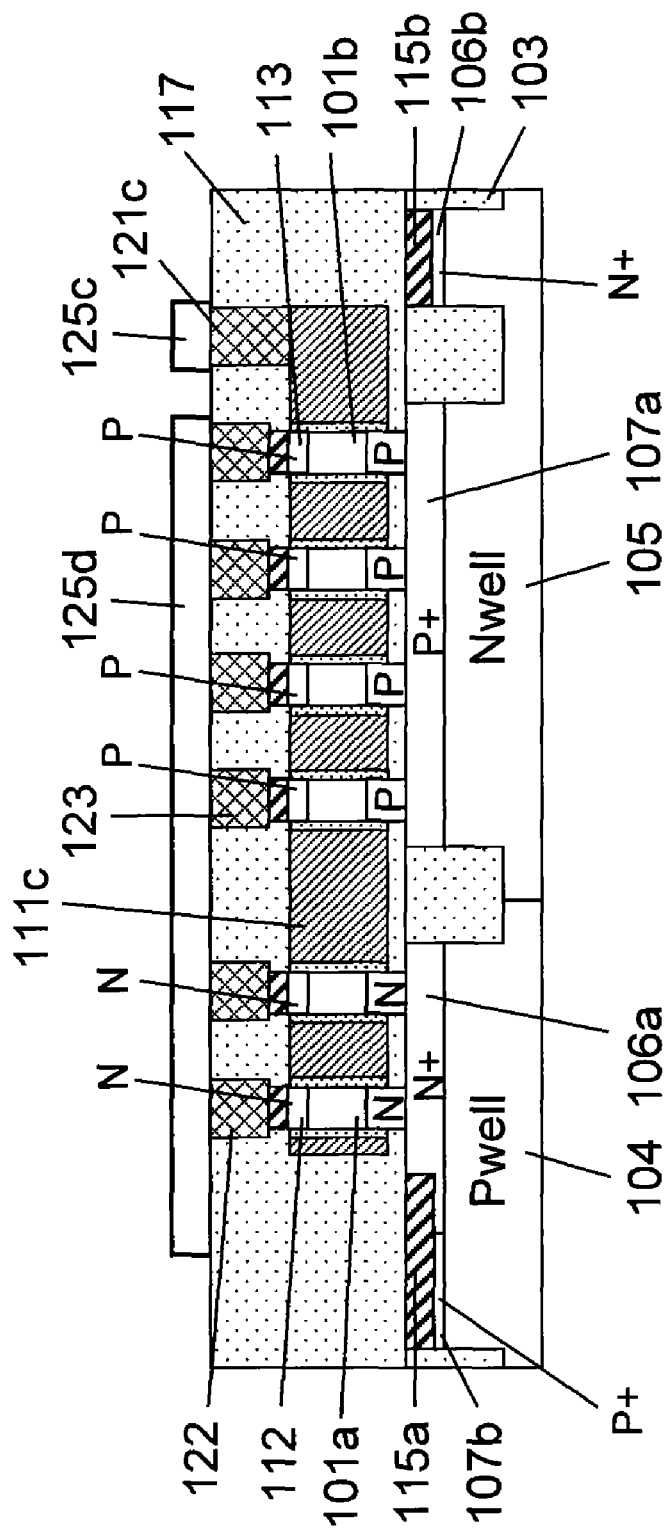
FIG. 32B is a cross-sectional view at the line B-B' in FIG. 31 for explaining a production method of Embodiment 1.

Subsequently, a metal film is formed on the entire substrate surface by vacuum deposition, sputtering, or the like and patterned to form wiring layers 125a to 125g as shown in FIGS. 31, 32A, and 32B.

In the above process, a semiconductor device comprising a CMOS inverter coupled circuit having the structure shown in FIGS. 1, 2A, and 2B in which CMOS inverters are coupled in at least two or more stages is completed.

Embodiment 2

Figure 33:
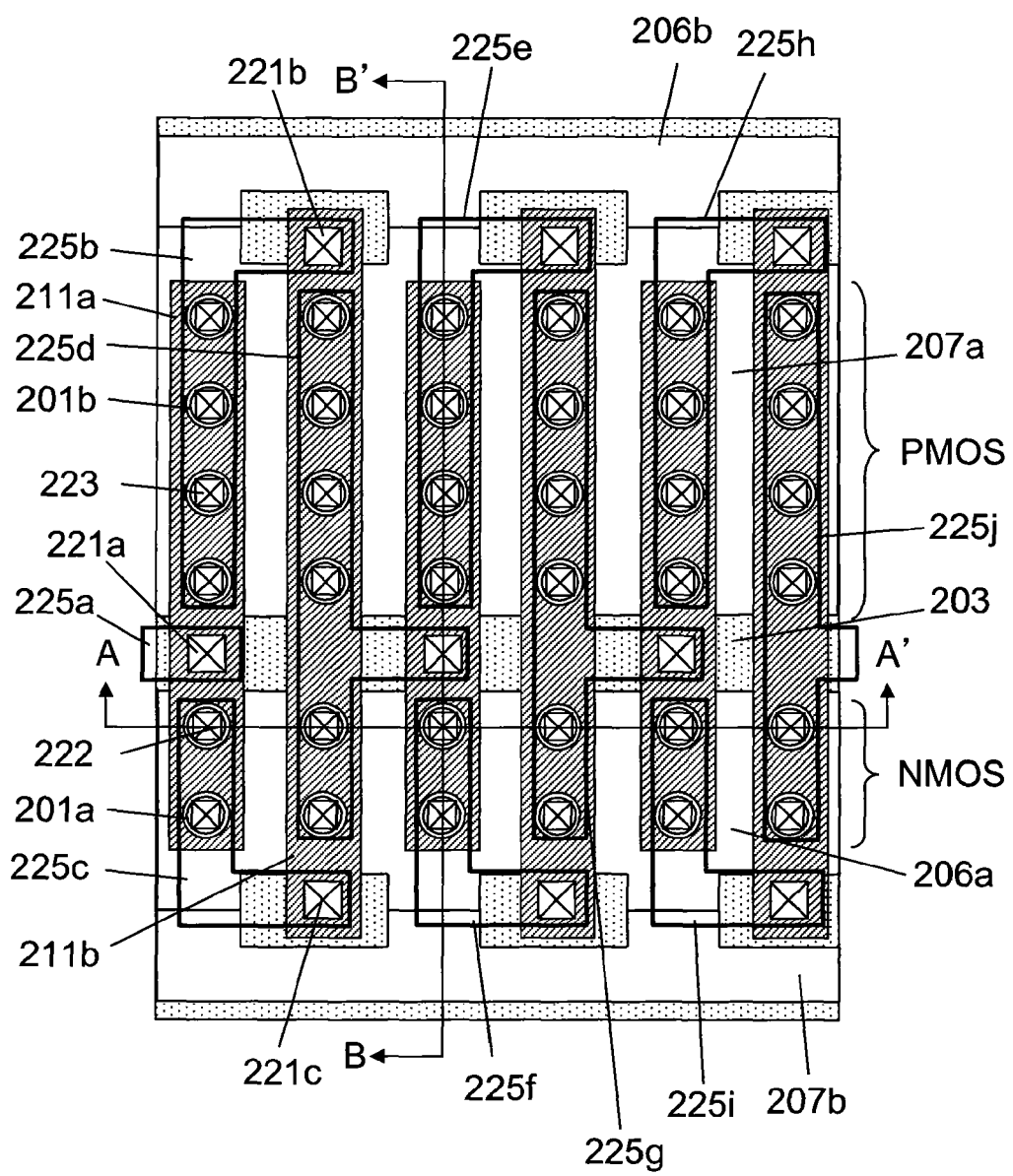
FIG. 33 is a plane view of the semiconductor device according to Embodiment 2 of the present invention.
Figure 34A:
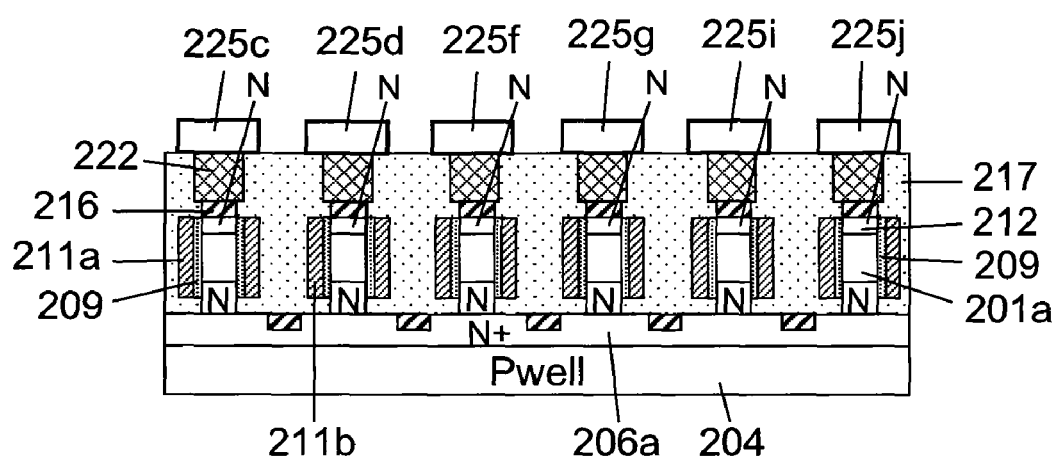
FIG. 34A is a cross-sectional view of the semiconductor device according to Embodiment 2 at the line A-A' in FIG. 33.
Figure 34B:
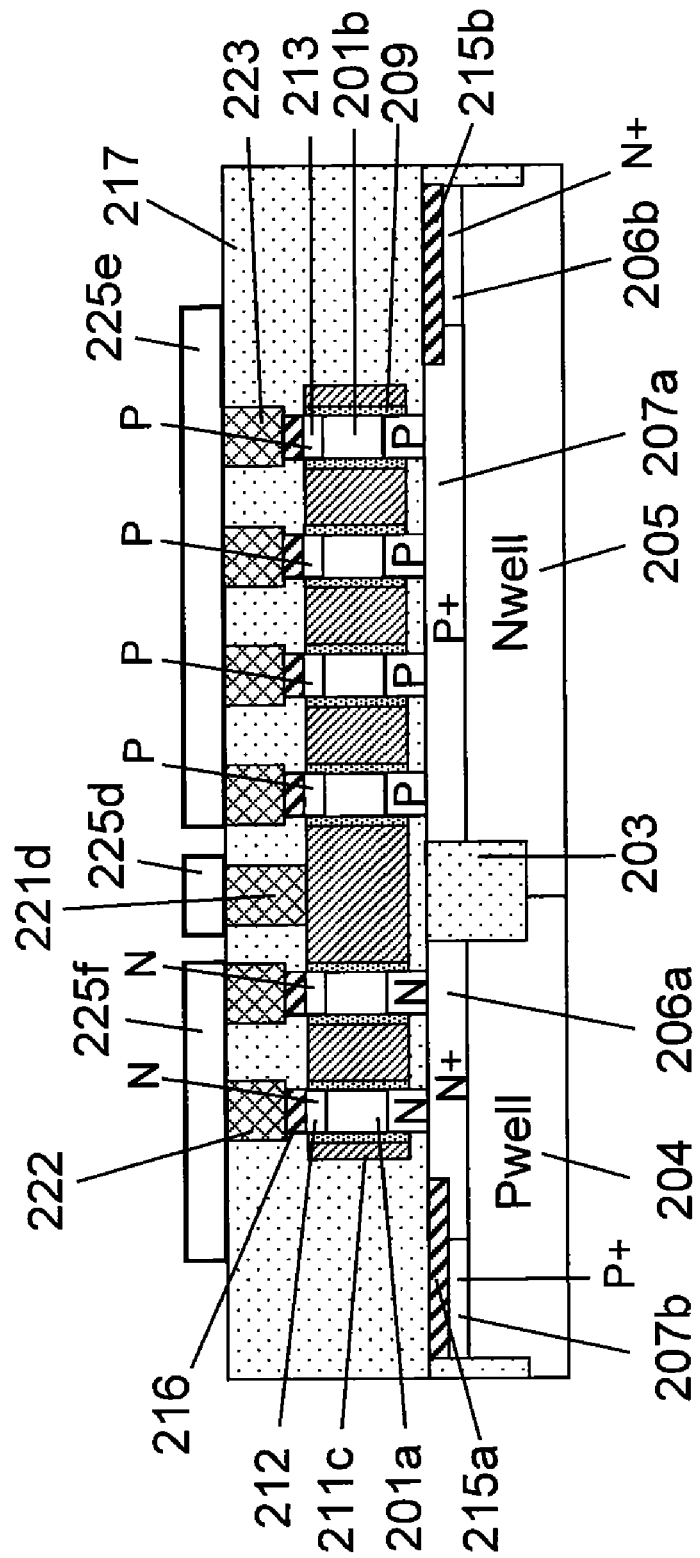
FIG. 34B is a cross-sectional view of the semiconductor device according to Embodiment 2 at the line B-B' in FIG. 33.

FIGS. 33, 34A, and 34B show another embodiment of two or more stage series-connected CMOS inverter.

FIG. 33 is a plane view, FIG. 34A is a cross-sectional view at the section line A-A' in the plane view of FIG. 33, and FIG. 34B is a cross-sectional view at the section line B-B' in the plane view of FIG. 33.

The CMOS inverter will be described hereafter with reference to FIGS. 33, 34A, and 34B.

An N+ diffusion layer 206a is formed in an NMOS region and a P+ diffusion layer 207a is formed in a PMOS region of a silicon substrate. The N+ diffusion layer 206a and P+ diffusion layer 207a is separated by an element separation region 203.

The N+ diffusion layer 206a is surrounded by a P well 204. The N+ diffusion layer 206a is connected to a P+ diffusion layer 207b formed next to the N+ diffusion layer 206a via a silicide layer 215a formed on the surface of the diffusion layer. A potential Vss is given to the P+ diffusion layer 207b via a wiring layer. Therefore, the potential Vss is also given to the P well 204 and N+ diffusion layer 206a.

The P+ diffusion layer 207a is surrounded by an N well 205. The P+ diffusion layer 207a is connected to an N+ diffusion layer 206b formed next to the P+ diffusion layer 207a via a silicide layer 215b formed on the surface of the diffusion layer. A potential Vcc is given to the N+ diffusion layer 206b via a wiring layer. Therefore, the potential Vcc is also given to the N well 205 and P+ diffusion layer 207a.

Columnar silicon layers 201a composing NMOSs are formed on the N+ diffusion layer 206a. Columnar silicon layers 201b composing PMOSs are formed on the P+ diffusion layer 207a.

The columnar silicon layers 201a and 20b are arranged in a matrix. The columnar silicon layers 201a and 201b in the same column of the matrix are aligned nearly on a line. The columnar silicon layers 201a and 201b in each column compose a stage of inverter. The columnar silicon layers 201a and 201b in the same row of the matrix are aligned nearly on a line.

A gate insulating film 209 is formed around each of the columnar silicon layers 201a and 201b. Gate wires 211a to 211f are formed around the columnar silicon layers 201a and 201b in each column (forming a stage of inverter).

An N+ upper diffusion layer 212 is formed in the upper end part of the columnar silicon layer 201a composing an NMOS. A silicide layer 216 is formed on the N+ upper diffusion layer 212.

A P+ upper diffusion layer 213 is formed in the upper end part of the columnar silicon layer 201b composing a PMOS. The silicide layer 216 is formed on the P+ upper diffusion layer 213.

The columnar silicon layers 201a and 201b, gate wires 211a to 211f, and silicide layer 216 are covered with an insulating film 217.

Gate wire contacts 221a to 221f leading to the gate wires 211a to 211f and columnar silicon layer contacts 222 and 223 electrically connected to the columnar silicon layers 201a and 201b are formed in the insulating film 217. The gate wire contact 221 of the inverters in odd-numbered stages is provided on the element separation region 203 separating the PMOS region from the NMOS region. The gate wire contact 221 of the inverters in even-numbered stages is provided on either end of the column of columnar silicon layers.

A wiring layer 225 (225a to 225j) is formed on the insulating film 217.

The wiring layer 225 includes a wiring layer 225a connected to the gate wire contact 221a of the first-stage inverter, wiring layers 225b and 225c connecting the columnar silicon layer contacts 223 of the inverters in odd-numbered stages to each other and connected to the gate wire contact 221b of the next-stage inverter, a wiring layer 225c connecting the columnar silicon layer contacts 222 of the inverters in odd-numbered stages to each other and connected to the gate wire contact 221c of the next-stage inverter, and a wiring layer 225d connecting the columnar silicon layer contacts 222 of the inverters in even-numbered stages to each other and connected to the gate wire contact 221d on the element separation region 203 of the next-stage inverter.

With the above structure, an input voltage to the inverter chain is transferred to the gate wire 211a of the first-stage inverter via the wiring layer 225a and gate wire contact 221a.

The output voltage of the first-stage inverter is output to the wiring layer 225c to which the columnar silicon layer contact 222 formed on the N+ upper diffusion layer 212 of the columnar silicon layer 201a is connected and to the wiring layer 225b to which the columnar silicon layer contact 223 formed on the P+ upper diffusion layer 213 of the columnar silicon layer 201b is connected. The output voltage is supplied as the input voltage to the gate wire contacts 221c and 221b formed on either end of the gate wire 211b of the next-stage inverter.

Then, the above operation is repeated. The output of the sixth-stage inverter is the output of the CMOS inverter coupled circuit.

This embodiment is characterized in that all inverters share the N+ diffusion layer 206a and P+ diffusion layer 207a. Therefore, there is no need of forming an element separation layer between inverters. Then, the columnar silicon layers composing adjacent inverters can be provided nearly at the minimum intervals. When the columnar silicon layers composing adjacent inverters are provided nearly at the minimum intervals, it is generally difficult to connect the input terminal and connection terminal via a wiring layer. However, in this embodiment, the inverters having the gate wire contact 221a, to which an input voltage is given, between the NMOS and PMOS regions and the inverters having the gate wire contacts 221b and 22c, to which an input voltage is given, at either end of the gate wire are alternately arranged next to each other, whereby it is easy to connect the input terminal and output terminal via a wiring layer. Consequently, a two or more stage series-connected CMOS inverter can be highly integrated.

Figure 35:
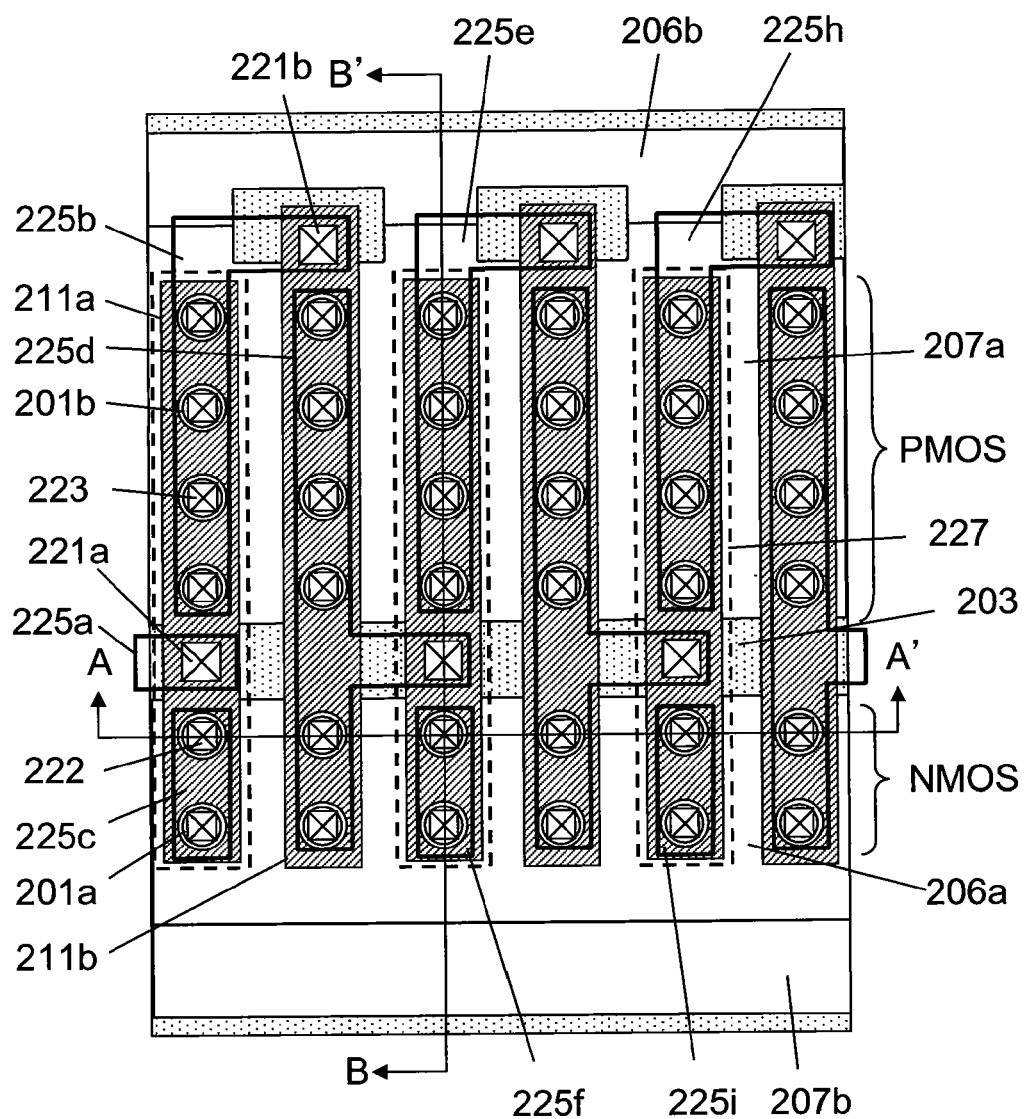
FIG. 35 is a plane view of the semiconductor device according to Embodiment 2 of the present invention.
Figure 36A:
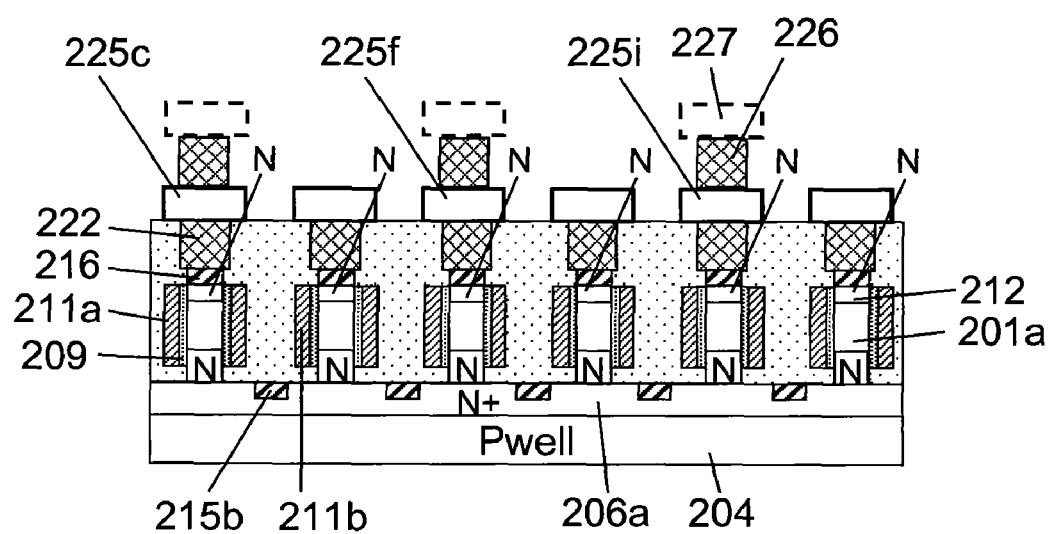
FIG. 36A is a cross-sectional view of the semiconductor device according to Embodiment 2 at the line A-A' in FIG. 35.
Figure 36B:
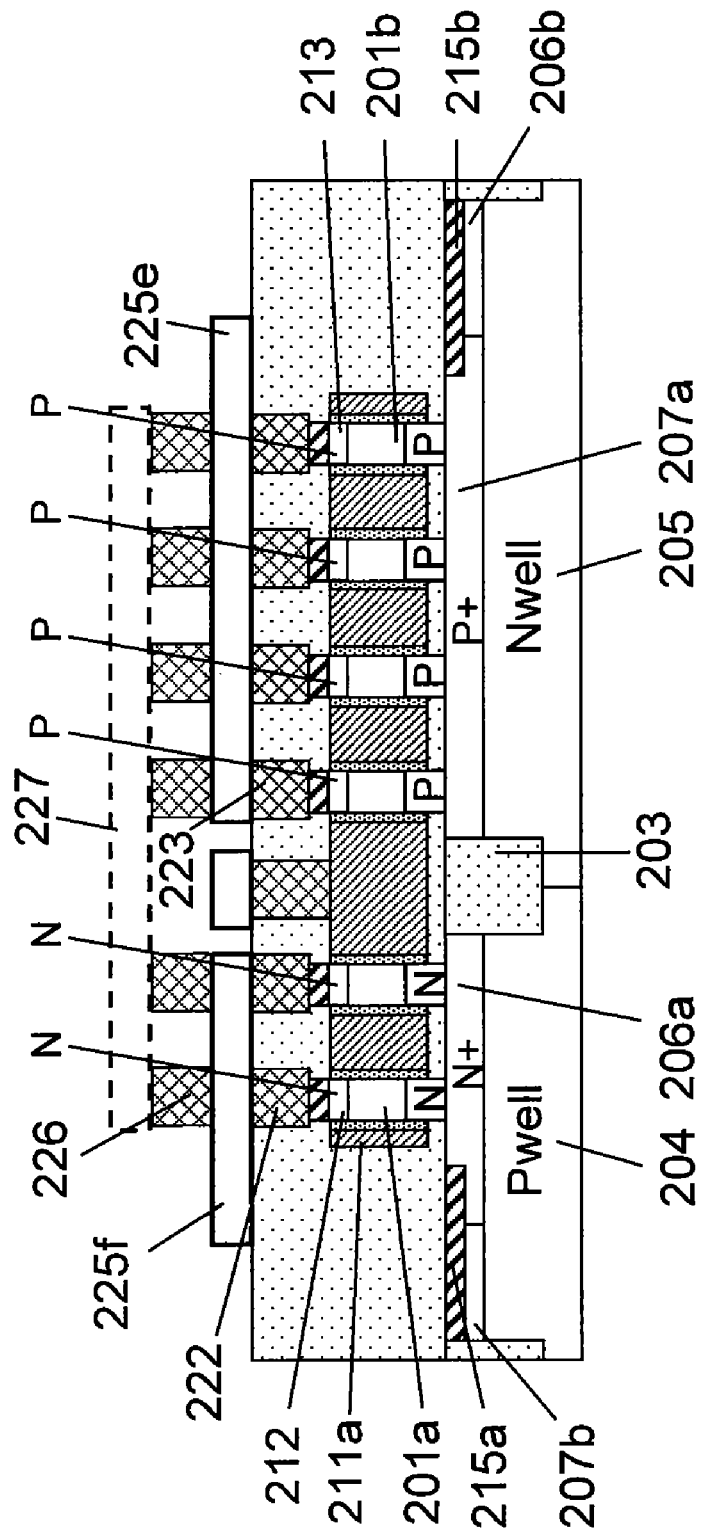
FIG. 36B is a cross-sectional view of the semiconductor device according to Embodiment 2 at the line B-B' in FIG. 35.
Figure 37A:
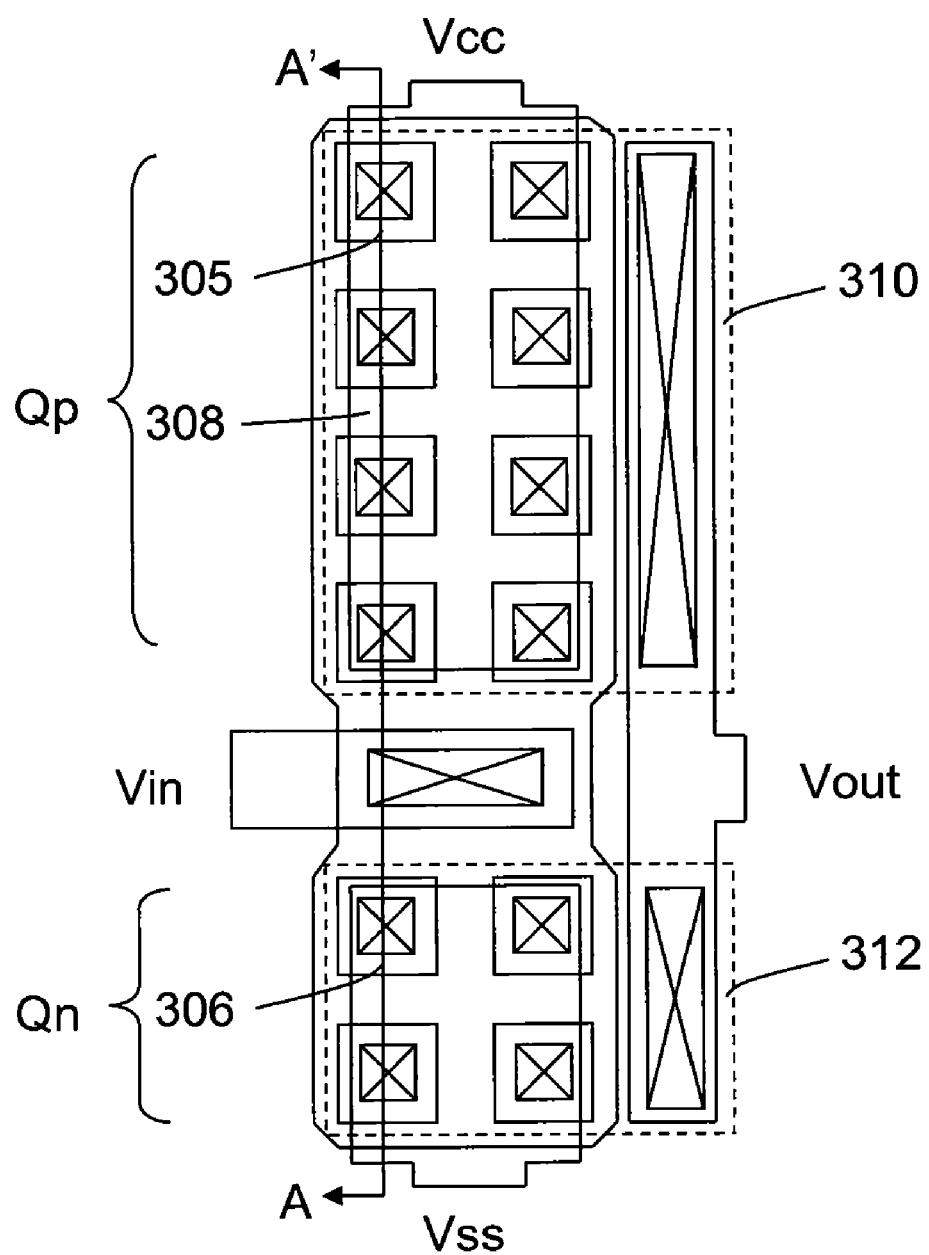
FIG. 37A is a plane view of a prior art semiconductor device.
Figure 37B:
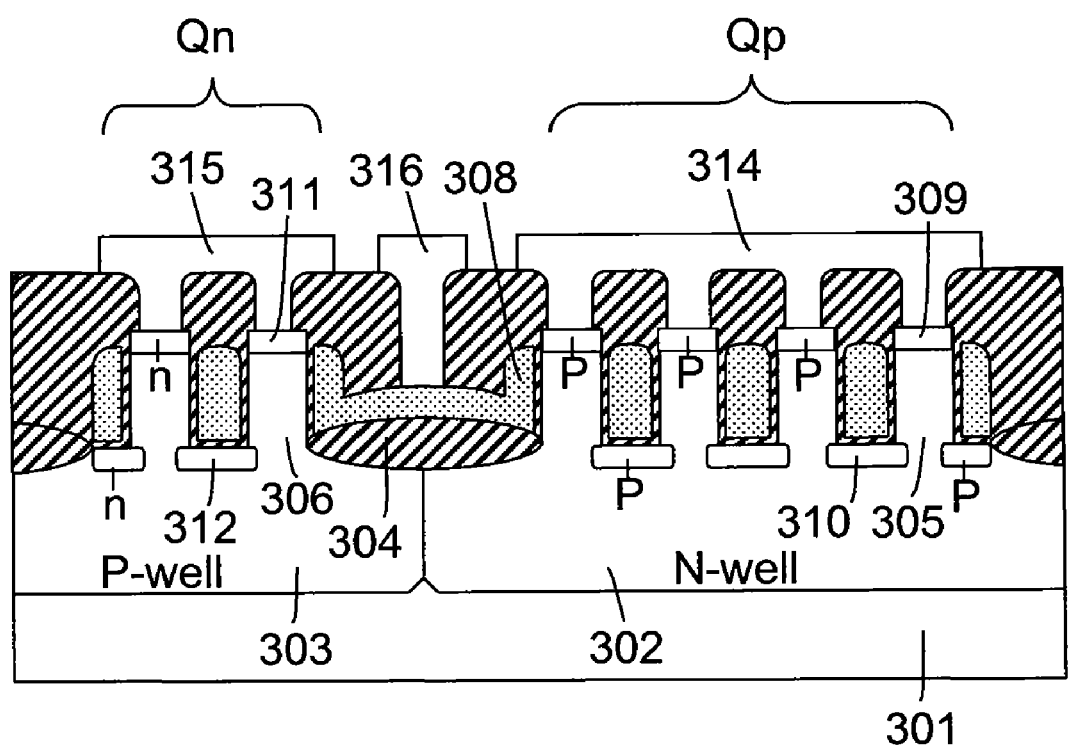
FIG. 37B is a cross-sectional view of a prior art semiconductor device at the line A-A' in FIG. 37A.
Figure 38A:
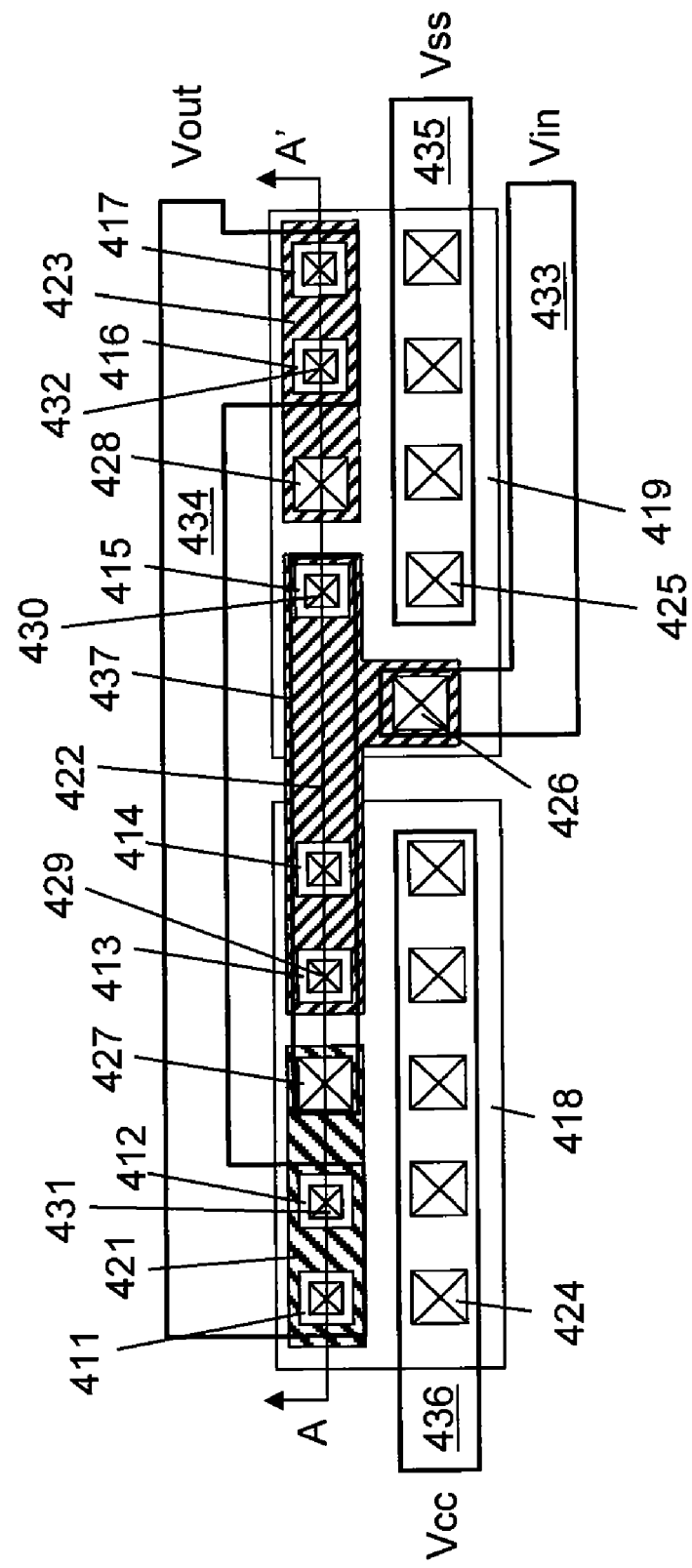
FIG. 38A is a plane view of another prior art semiconductor device.
Figure 38B:
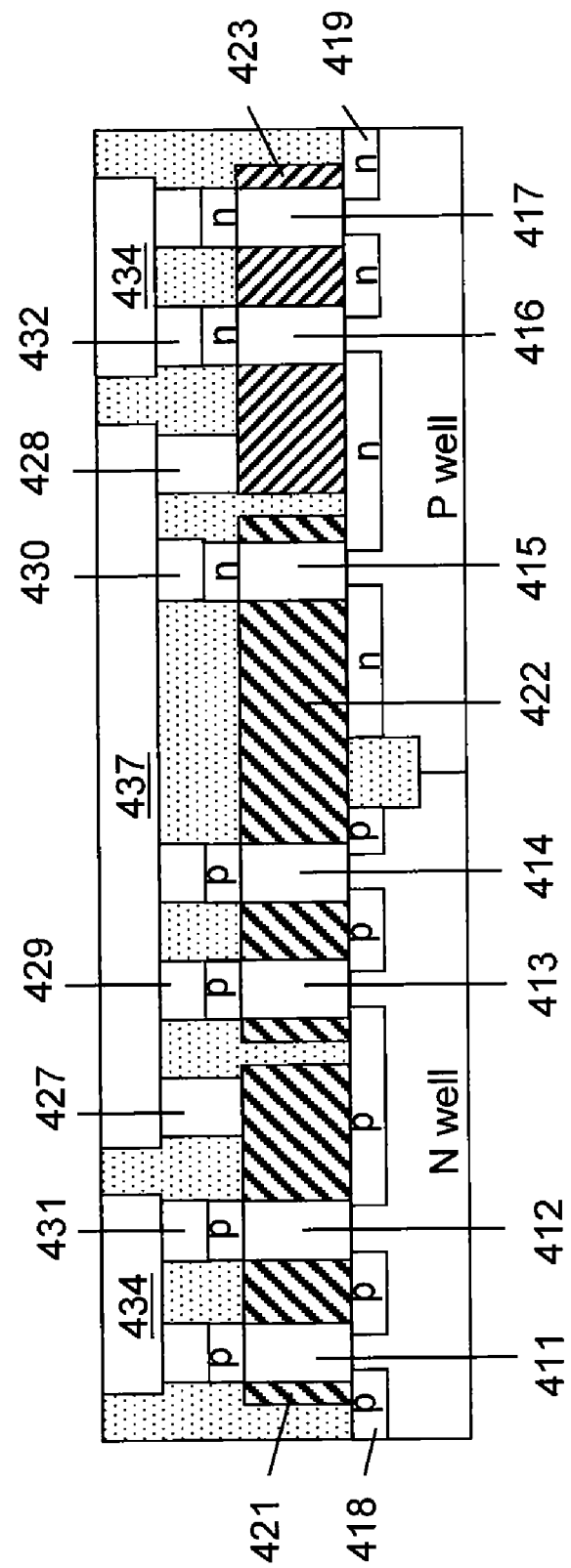
FIG. 38B is a cross-sectional view of another prior art semiconductor device at the line A-A' in FIG. 38A.
Figure 39A:
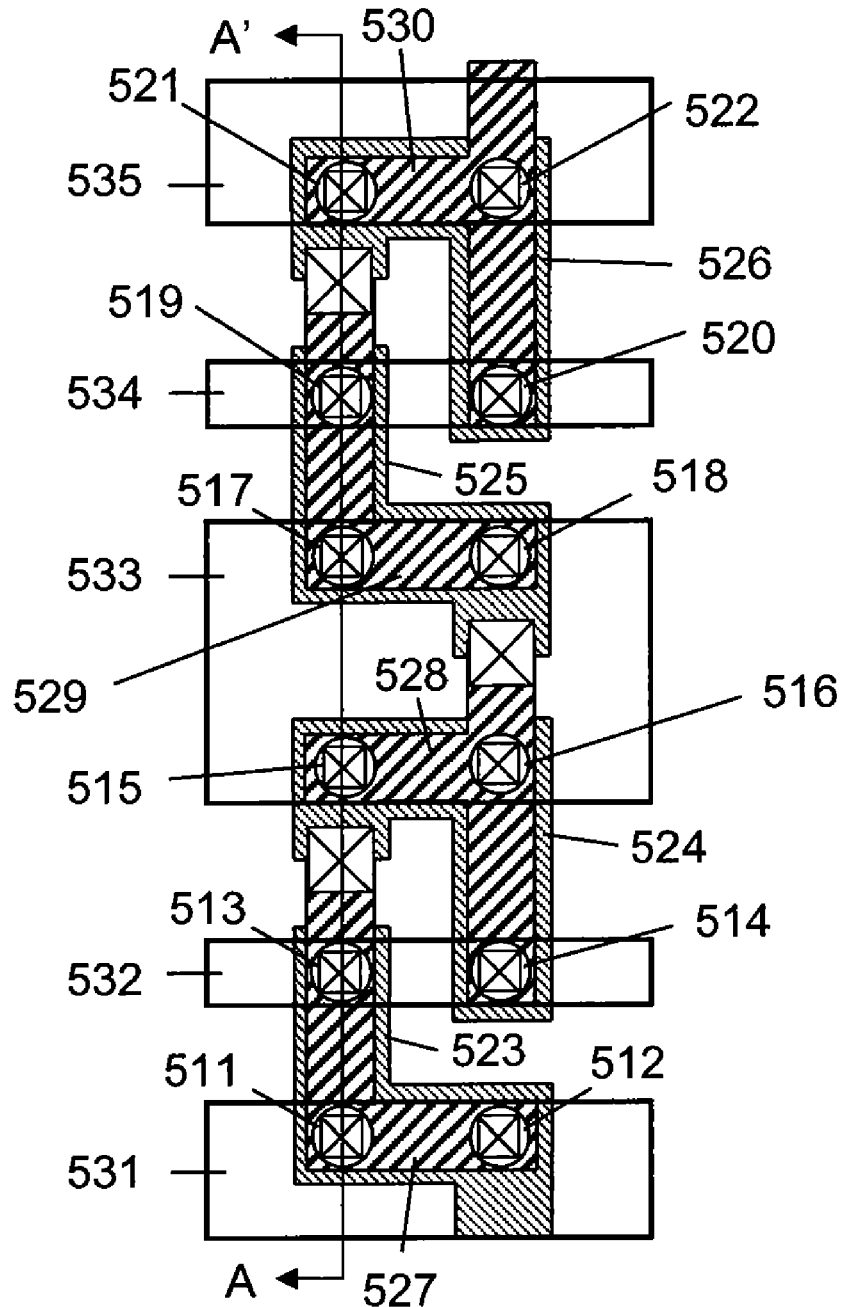
FIG. 39A is a plane view of a further other prior art semiconductor device.
Figure 39B:
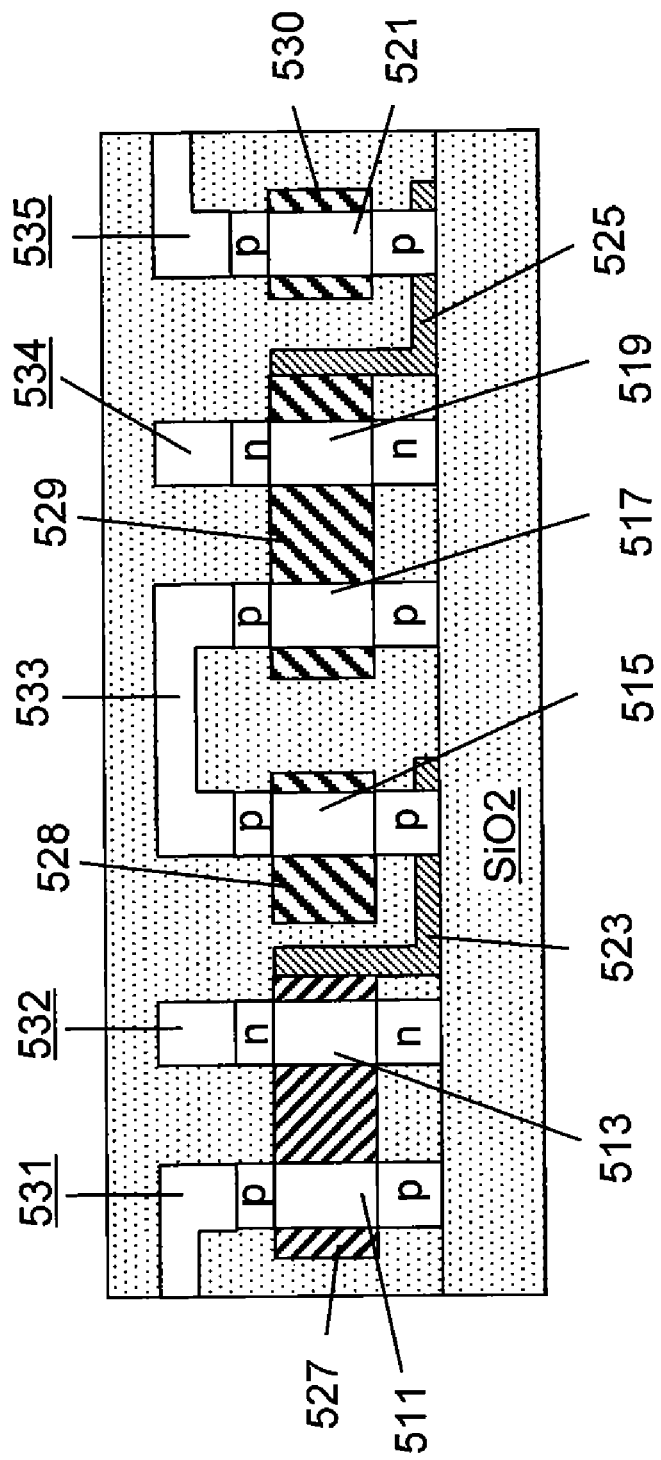
FIG. 39B is a cross-sectional view of a further other prior art semiconductor device at the line A-A' in FIG. 39A.

In this embodiment, the output from the drain diffusion layer in the upper part of the columnar silicon layer 201a composing an NMOS is output to the wiring layer 225c, 225f, or 225i, the output from the drain diffusion layer in the upper part of the columnar silicon layer 201b composing a PMOS is output to the wiring layer 225b, 225e, or 225h; they are supplied to the gate wire in the next stage separately. The present invention is not restricted thereto. As shown in FIGS. 35, 36A, and 36B, the wiring layers 225b, 225e, and 225h and wiring layers 225c, 222f, and 225i can directly be connected by using an upper wiring layer 227 and a wiring layer contact 226 to the upper wiring layer 227, respectively. In such a case, the input to the gate in the next stage does not need to be supplied through the contacts formed on either end of the gate. A contact can be formed only on one end of the gate as shown in FIGS. 35, 36A, and 36B.

In the above embodiments, silicon is used as semiconductor. Germanium, compound semiconductors, and the like can be used as long as a vertical MOS transistor can be formed.

The substances named above are given by way of example and not restrictive.

Having described and illustrated the principles of this application by reference to one (or more) preferred embodiment(s), it should be apparent that the preferred embodiment(s) may be modified in arrangement and detail without departing from the principles disclosed herein and that it is intended that the application be construed as including all such modifications and variations insofar as they come within the spirit and scope of the subject matter disclosed herein.

What is claimed is:

1. A semiconductor device comprising a CMOS inverter coupled circuit in which CMOS inverters are connected in at least two or more stages, wherein:
   said CMOS inverters are composed of vertical MOS transistors in which a source diffusion layer, a drain diffusion layer, and a columnar semiconductor layer are provided in a vertical hierarchical structure, said columnar semiconductor layer is provided between said source diffusion layer and drain diffusion layer, and a gate electrode is formed on the sidewall of said columnar semiconductor layer;

said CMOS inverter coupled circuit includes a first CMOS inverter in the first stage that is composed of multiple vertical MOS transistors aligned in the first column on a substrate and a second CMOS inverter in the second stage that is composed of multiple vertical MOS transistors aligned in the second column on said substrate;

said multiple vertical MOS transistors aligned in the first column are composed of one or multiple first NMOS vertical transistors formed on a first N+ source diffusion layer and one or multiple first PMOS vertical transistors formed on a first P+ source diffusion layer;

said first N+ source diffusion layer and first P+ source diffusion layer are formed next to each other;

a first potential is supplied to said first N+ source diffusion layer and a second potential is supplied to said first P+ source diffusion layer;

the gate electrode of said one or multiple first NMOS vertical transistors and the gate electrode of said one or multiple first PMOS vertical transistors are connected and form a first gate wire;

a first contact for supplying an input voltage to the first CMOS inverter is formed at an end of said first gate wire;

a first N+ drain diffusion layer is formed in the upper part of columnar semiconductor layers composing said one or multiple first NMOS vertical transistors, and a second contact connecting said first N+ drain diffusion layer and a first wiring layer to which the output voltage of said first inverter is output is formed on said first N+ drain diffusion layer;

a first P+ drain diffusion layer is formed in the upper part of columnar semiconductor layers composing said one or multiple first PMOS vertical transistors, and a third contact connecting said first P+ drain diffusion layer and the first wiring layer to which the output voltage of said first inverter is output is formed on said first P+ drain diffusion layer;

said multiple vertical MOS transistors aligned in the second column are formed by one or multiple second NMOS vertical transistors formed on said first N+ source diffusion layer and one or multiple second PMOS vertical transistors formed on said first P+ source diffusion layer;

the gate electrode of said one or multiple second NMOS vertical transistors and the gate electrode of said one or multiple second PMOS vertical transistors are connected and form a second gate wire;

a fourth contact for supplying an input voltage to the second CMOS inverter is formed at the other end of said second gate wire;

said fourth contact is connected to said first wiring layer;

a second N+ drain diffusion layer is formed in the upper part of columnar semiconductor layers composing said one or multiple second NMOS vertical transistors, and a fifth contact connecting said second N+ drain diffusion layer and a second wiring layer to which the output voltage of said second inverter is output is formed on said second N+ drain diffusion layer;

a second P+ drain diffusion layer is formed in the upper part of columnar semiconductor layers composing said one or multiple second PMOS vertical transistors, and a sixth contact connecting said second P+ drain diffusion layer and the second wiring layer to which the output voltage of said second inverter is output is formed on said second P+ drain diffusion layer; and said first CMOS inverter and second CMOS inverter are alternately connected.

2. A semiconductor device comprising a CMOS inverter coupled circuit in which CMOS inverters are connected in at least two or more stages, wherein:

said CMOS inverters are composed of vertical MOS transistors in which a source diffusion layer, a drain diffusion layer, and a columnar semiconductor layer are provided in a vertical hierarchical structure, said columnar semiconductor layer is provided between said source diffusion layer and drain diffusion layer, and a gate electrode is formed on the sidewall of said columnar semiconductor layer;

said CMOS inverter coupled circuit includes a first CMOS inverter in the first stage that is composed of multiple vertical MOS transistors aligned in the first column on a substrate and a second CMOS inverter in the second stage that is composed of multiple vertical MOS transistors aligned in the second column on said substrate;

said multiple vertical MOS transistors aligned in the first column are composed of one or multiple first NMOS vertical transistors formed on a first N+ source diffusion layer and one or multiple first PMOS vertical transistors formed on a first P+ source diffusion layer;

said first N+ source diffusion layer and first P+ source diffusion layer are formed next to each other;

a first potential is supplied to said first N+ source diffusion layer and a second potential is supplied to said first P+ source diffusion layer;

the gate electrode of said one or multiple first NMOS vertical transistors and the gate electrode of said one or multiple first PMOS vertical transistors are connected and form a first gate wire;

a first contact for supplying an input voltage to the first CMOS inverter is formed on said first gate wire in the region above an element separation formed between said first N+ source diffusion layer and first P+ source diffusion layer;

a first N+ drain diffusion layer is formed in the upper part of columnar semiconductor layers forming said one or multiple first NMOS vertical transistors, and a second contact connecting said first N+ drain diffusion layer and a first wiring layer to which the output voltage of said first inverter is output is formed on said first N+ drain diffusion layer;

a first P+ drain diffusion layer is formed in the upper part of columnar semiconductor layers composing said one or multiple first PMOS vertical transistors, and a third contact connecting said first P+ drain diffusion layer and a second wiring layer to which the output voltage of said first inverter is output is formed on said first P+ drain diffusion layer;

said multiple vertical MOS transistors aligned in the second column are formed by one or multiple second NMOS vertical transistors formed on said first N+ source diffusion layer and one or multiple second PMOS vertical transistors formed on said first P+ source diffusion layer;

the gate electrode of said one or multiple second NMOS vertical transistors and the gate electrode of said one or multiple second PMOS vertical transistors are connected and form a second gate wire;

a fourth contact for supplying an input voltage to the second CMOS inverter is formed at one end of said second gate wire;

said fourth contact is connected to said first wiring layer;

a fifth contact for supplying an input voltage to the second CMOS inverter is formed at the other end of said second gate wire;

said fifth contact is connected to said second wiring layer;
a second N+ drain diffusion layer is formed in the upper part of columnar semiconductor layers forming said one or multiple second NMOS vertical transistors, and a sixth contact connecting said second N+ drain diffusion layer and a third wiring layer to which the output voltage of said second CMOS inverter is output is formed on said second N+ drain diffusion layer;
a second P+ drain diffusion layer is formed in the upper part of columnar semiconductor layers composing said one or multiple second PMOS vertical transistors, and a seventh contact connecting said second P+ drain diffusion layer and the third wiring layer to which the output voltage of said second CMOS inverter is output is formed on said second P+ drain diffusion layer; and
said first CMOS inverter and second CMOS inverter are alternately connected.

3. The semiconductor device according to claim 2 wherein said first wiring layer and second wiring layer are connected to each other by a fourth wiring layer formed on a layer above said first wiring layer and said second wiring layer.

4. A semiconductor device comprising a CMOS inverter coupled circuit in which CMOS inverters are connected in at least two or more stages, wherein:
said CMOS inverters are composed of vertical MOS transistors in which a source diffusion layer, a drain diffusion layer, and a columnar semiconductor layer are provided in a vertical hierarchical structure, said columnar semiconductor layer is provided between said source diffusion layer and drain diffusion layer, and a gate electrode is formed on the sidewall of said columnar semiconductor layer;
said CMOS inverter coupled circuit includes a first CMOS inverter in the first stage that is composed of multiple vertical MOS transistors aligned in the first column on a substrate and a second CMOS inverter in the second stage that is composed of multiple vertical MOS transistors aligned in the second column on said substrate;
said multiple vertical MOS transistors aligned in the first column are composed of one or multiple first NMOS vertical transistors formed on a first N+ source diffusion layer and one or multiple first PMOS vertical transistors formed on a first P+ source diffusion layer;
said first N+ source diffusion layer and first P+ source diffusion layer are formed next to each other;
a first potential is supplied to said first N+ source diffusion layer and a second potential is supplied to said first P+ source diffusion layer;
the gate electrode of said one or multiple first NMOS vertical transistors and the gate electrode of said one or multiple first PMOS vertical transistors are connected and form a first gate wire;
a first contact for supplying an input voltage to the first CMOS inverter is formed on said first gate wire in the region above an element separation formed between said first N+ source diffusion layer and first P+ source diffusion layer;
a first N+ drain diffusion layer is formed in the upper part of columnar semiconductor layers forming said one or multiple first NMOS vertical transistors, and a second contact connecting said first N+ drain diffusion layer and a first wiring layer to which the output voltage of said first inverter is output is formed on said first N+ drain diffusion layer;
a first P+ drain diffusion layer is formed in the upper part of columnar semiconductor layers composing said one or multiple first PMOS vertical transistors, and a third contact connecting said first P+ drain diffusion layer and a second wiring layer to which the output voltage of said first inverter is output is formed on said first P+ drain diffusion layer;
said first wiring layer and second wiring layer are connected by a third wiring layer formed on a layer above said first wiring layer and said second wiring layer;
said multiple vertical MOS transistors aligned in the second column are formed by one or multiple second NMOS vertical transistors formed on said first N+ source diffusion layer and one or multiple second PMOS vertical transistors formed on said first P+ source diffusion layer;
the gate electrode of said one or multiple second NMOS vertical transistors and the gate electrode of said one or multiple second PMOS vertical transistors are connected and form a second gate wire;
a fourth contact for supplying an input voltage to said second CMOS inverter is formed at one end of said second gate wire;
said fourth contact is connected to said first wiring layer or said second wiring layer;
a fifth contact connecting a second N+ drain diffusion layer formed in the upper part of columnar semiconductor layers forming said one or multiple second NMOS vertical transistors and a fourth wiring layer to which the output voltage of said second CMOS inverter is output is formed on said second N+ drain diffusion layer;
a second P+ drain diffusion layer is formed in the upper part of columnar semiconductor layers composing said one or multiple second PMOS vertical transistors, and a sixth contact connecting said second P+ drain diffusion layer and the fourth wiring layer to which the output voltage of said second inverter is output is formed on said second P+ drain diffusion layer; and
said first CMOS inverter and second CMOS inverter are alternately connected.

* * * * *